US009013924B2

(12) United States Patent
Yang

(10) Patent No.: US 9,013,924 B2
(45) Date of Patent: Apr. 21, 2015

(54) SEMICONDUCTOR DEVICE AND OPERATING METHOD THEREOF

(75) Inventor: Chang Won Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 113 days.

(21) Appl. No.: 13/471,550

(22) Filed: May 15, 2012

(65) Prior Publication Data

US 2012/0294093 A1   Nov. 22, 2012

(30) Foreign Application Priority Data

May 16, 2011   (KR) .......................... 10-2011-0045721

(51) Int. Cl.
| | | |
|---|---|---|
| G11C 16/06 | (2006.01) | |
| G11C 16/10 | (2006.01) | |
| G11C 11/56 | (2006.01) | |
| G11C 16/04 | (2006.01) | |
| G11C 16/26 | (2006.01) | |
| G11C 16/32 | (2006.01) | |

(52) U.S. Cl.
CPC ............ *G11C 16/10* (2013.01); *G11C 11/5642* (2013.01); *G11C 16/0483* (2013.01); *G11C 16/26* (2013.01); *G11C 16/32* (2013.01)

(58) Field of Classification Search
USPC ................................................... 365/185.22
See application file for complete search history.

(56) References Cited

U.S. PATENT DOCUMENTS

| | | | | |
|---|---|---|---|---|
| 7,551,487 | B2 * | 6/2009 | Park et al. ................ | 365/185.22 |
| 2004/0202028 | A1 * | 10/2004 | Cioaca ..................... | 365/189.11 |
| 2010/0008136 | A1 * | 1/2010 | Seol et al. ................. | 365/185.2 |
| 2010/0027332 | A1 * | 2/2010 | Lee et al. ................. | 365/185.03 |
| 2010/0302852 | A1 * | 12/2010 | Oh .......................... | 365/185.12 |

FOREIGN PATENT DOCUMENTS

KR    1020110001591    1/2011

OTHER PUBLICATIONS

Office Action issued from the Korean Intellectual Property Office on Jul. 20, 2012.

* cited by examiner

*Primary Examiner* — Anthan Tran
(74) *Attorney, Agent, or Firm* — IP & T Group LLP

(57) ABSTRACT

An operating method of a semiconductor device includes precharging bit lines corresponding to selected memory cells, supplying a first verify voltage to a word line coupled to the selected memory cells and outputting programming states of the selected memory cells to the bit lines during a first time period, sensing potentials of the bit lines that have the programming states of the selected memory cells outputted to the bit lines during the first time period, supplying a first target voltage higher than the first verify voltage to the word line and outputting programming states of the selected memory cells to the bit lines during a second time period shorter than the first time period, and sensing potentials of the bit lines that have the programming states of the selected memory cells outputted to the bit lines during the second time period.

22 Claims, 6 Drawing Sheets

SEMICONDUCTOR DEVICE AND OPERATING METHOD THEREOF

CROSS-REFERENCE TO RELATED APPLICATION

Priority to Korean patent application number 10-2011-0045721 filed on May 16, 2011, the entire disclosure of which is incorporated by reference herein, is claimed.

BACKGROUND

Exemplary embodiments relate to a semiconductor device and an operating method thereof and, more particularly, to an operation of verifying a program operation.

The program operation of a semiconductor device includes a program pulse operation that raises the threshold voltage of a memory cell to be programmed by supplying a program pulse to a word line coupled to the memory cell and a verify operation that determines whether the raised threshold voltage has reached a target level. The verify operation is described in detail below.

In a single level cell (hereafter referred to as an SLC) programmed in a single level, a single verify level is used in a verify operation because the SLC have one target level. More specifically, the verify operation of the SLC is performed to determine whether the threshold voltage of the SLC is higher than or lower than a verify voltage by supplying the verify voltage, which has a target level, to a word line coupled to the SLC.

In case of a multi-level cell (hereafter referred to as an MLC) programmed in a plurality levels, a plurality of verify voltages are used in a verify operation because the MLC has a plurality of target levels. Accordingly, the verify operation of MLCs is performed in such a way as to sequentially verify the threshold voltages of the MLCs from an MLC having the lowest target level to an MLC having the highest target level.

For example, if one memory cell is programmed in a first state, a second state higher than the first state, or a third state higher than the second state according to the threshold voltage of the memory cell, a verify operation corresponding to the first state is first performed, and verify operations corresponding to the second and the third states are sequentially performed after the verify operation of the first state. A program operation is repeated until the threshold voltages of memory cells to be programmed reaches respective target levels while changing the potentials of bit lines corresponding to the memory cells in response top the result of the verification.

Particularly, a verify operation includes a precharge operation where a bit line is precharged, an evaluation operation where the state of a memory cell corresponding to the bit line is outputted or incorporated into the potential of the bit line, and a sense operation that determines whether the threshold voltage of the memory cell has reached a target level in response to a changed potential of the bit line. Accordingly, the time taken to perform the verify operation of an MLC is increased because the MLC has a plurality of verify levels. Also leakage may occur as a result of the long verify operation. Consequently, a semiconductor device may have deteriorated reliability.

BRIEF SUMMARY

An exemplary embodiment relates to a reduction in the operation time by consecutively verifying MLCs with a plurality of levels in the verify operation of the MLCs.

Another exemplary embodiment relates to preventing a reduction in reliability of a verify operation due to the precharged voltage of a bit line, which is lowered as a result of leakage, by reducing the time taken to perform the evaluation section of a verify operation.

An operating method of a semiconductor device according to an aspect of the present disclosure includes precharging bit lines corresponding to selected memory cells; supplying a first verify voltage to a word line coupled to the selected memory cells and outputting programming states of the selected memory cells to the bit lines during a first time period; sensing potentials of the bit lines that have the programming states of the selected memory cells outputted to the bit lines during the first time period; supplying a first target voltage higher than the first verify voltage to the word line and outputting programming states of the selected memory cells to the bit lines during a second time period shorter than the first time period; and sensing potentials of the bit lines that have the programming states of the selected memory cells outputted to the bit lines during the second time period.

An operating method of a semiconductor device according to another aspect of the present disclosure includes precharging bit lines corresponding to selected memory cells; supplying a first verify voltage to a word line coupled to the selected memory cells and outputting programming states of the selected memory cells to the bit lines during a first time period; sensing potentials of the bit lines that have the programming states of the selected memory cells outputted to the bit lines during the first time period; consecutively supplying a first target voltage higher than the first verify voltage to the word line and outputting programming states of the selected memory cells to the bit lines during a second time period shorter than the first time period; sensing potentials of the bit lines that have the programming states of the selected memory cells outputted to the bit lines during the second time period; consecutively supplying a second target voltage higher than the first target voltage to the word line and outputting programming states of the selected memory cells to the bit lines during the second time period; and sensing potentials of the bit lines that have the programming states of the selected memory cells outputted to the bit lines during the second time period.

An operating method of a semiconductor device according to yet another aspect of the present disclosure includes precharging bit lines corresponding to selected memory cells; supplying a first verify voltage to a word line coupled to the selected memory cells, outputting programming states of the selected memory cells to the bit lines during a first time period, and subsequently sensing potentials of the bit lines; consecutively supplying a first target voltage higher than the first verify voltage to the word line, outputting programming states of the selected memory cells to the bit lines during a second time period shorter than the first time period, and subsequently sensing potentials of the bit lines; consecutively supplying a second target voltage higher than the first target voltage to the word line, outputting programming states of the selected memory cells to the bit lines during a third time period shorter than the second time period, and subsequently sensing potentials of the bit lines; and consecutively supplying a third target voltage higher than the second target voltage to the word line, outputting programming states of the selected memory cells to the bit lines during a fourth time period shorter than the third time period, and subsequently sensing potentials of the bit lines.

A semiconductor device according to an aspect of the present disclosure includes a memory cell array configured to comprise a memory cell array including a plurality of strings;

page buffers coupled to the plurality of strings through bit lines; and a controller configured to generate page buffer control signals for controlling the page buffers so that a time period when programming states of selected memory cells are verified in a verify operation is controlled.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
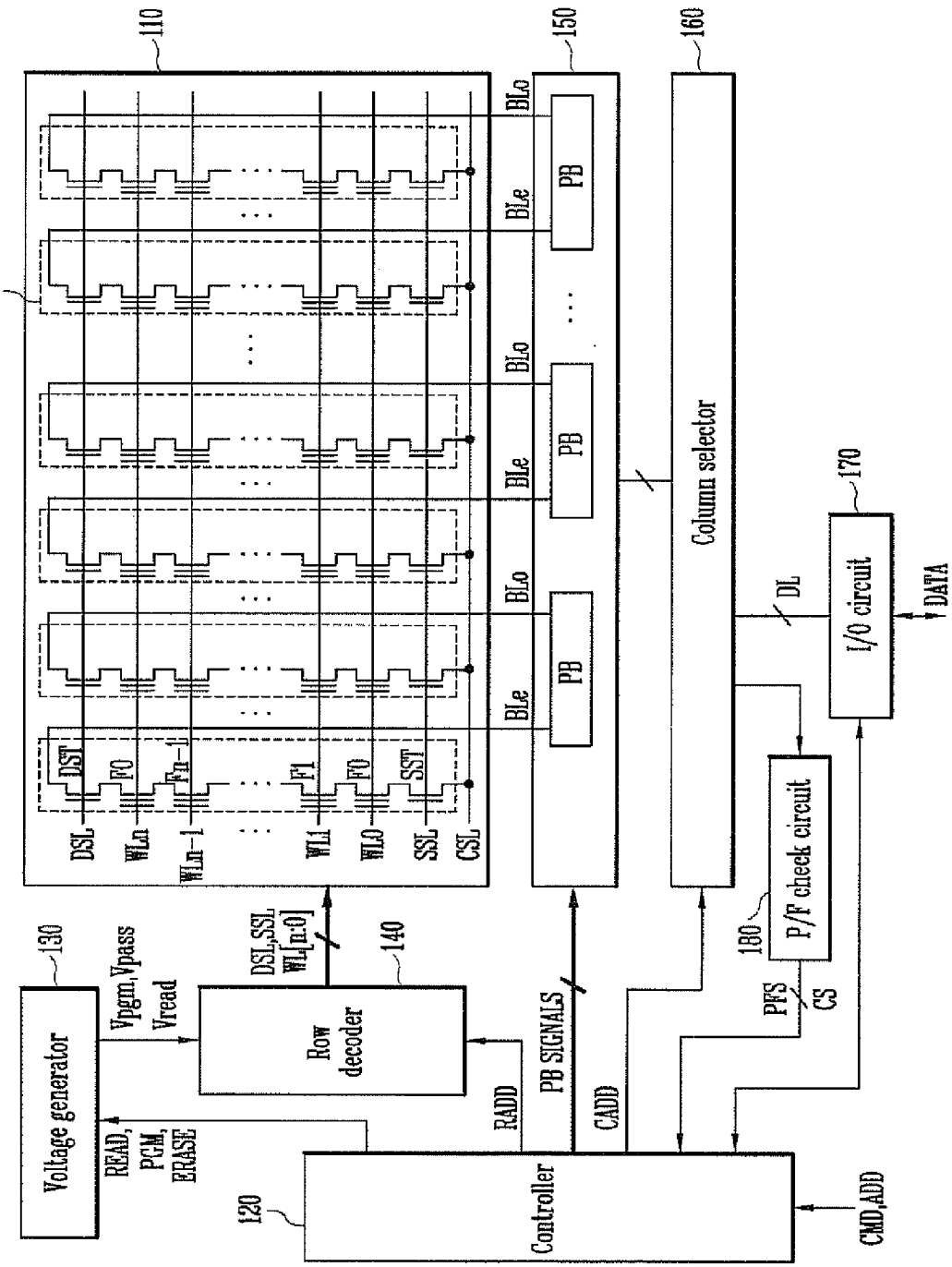
FIG. 1 is a block diagram of a semiconductor device according to this disclosure.

FIG. 1 is a block diagram of a semiconductor device according to this disclosure.

Referring to FIG. 1, the semiconductor memory device includes a memory cell array 110, the circuit group (130, 140, 150, 160, 170, and 180) configured to perform a program operation or a read operation for memory cells included in the memory cell array 110, and a controller 120 configured to control the circuit group (130, 140, 150, 160, 170, and 180) to set the threshold voltages of selected memory cells in response to received data.

In case of a NAND flash memory device, the circuit group includes a voltage generator 130, a row decoder 140, a page buffer group 150, a column selector 160, an I/O circuit 170, and a Pass/Fail (P/F) check circuit 180.

The memory cell array 110 includes a plurality of memory cell blocks. One of the memory cell blocks is shown in FIG. 1. The memory cell block includes a plurality of strings ST. A first group of the strings ST is designated as normal strings, and a second group of strings, which does not include the first group of strings, is designated as flag strings. The normal strings and the flag strings have the same construction. Each of the strings ST includes a source select transistor SST coupled to a common source line CSL, a plurality of memory cells F0 to Fn, and a drain select transistor DST coupled to a bit line BLe or BLo. Memory cells included in the flag string are called flag cells, but the flag cells have the same construction as memory cells included in the normal string. The gate of the source select transistor SST is coupled to a source select line SSL. The gates of the memory cells F0 to Fn are coupled to respective word lines WL0 to WLn. The gate of the drain select transistor DST is coupled to a drain select line DSL. The strings ST are coupled to the respective bit lines BLe or BLo and are coupled to the common source line CSL.

The controller 120 generates a program operation signal PGM, a read operation signal READ, or an erase operation signal ERASE in response to a command signal CMD. The controller 120 also generates page buffer signals PB SIG-NALS for controlling the page buffers PB of the page buffer group 150 according to a type of an operation. Furthermore, the controller 120 generates a row address signal RADD and a column address signal CADD in response to an address signal ADD. The controller 120 checks whether the threshold voltages of memory cells have risen to a target voltage in response to a check signal PFS of the P/F check circuit 180 in a program verify operation and determines whether to perform the program operation again or to terminate the program operation in response to the result of the check.

The voltage supply circuit (130, 140) supplies the drain select line DSL, the word lines WL0 to WLn, and the source select line SSL of the memory cell block with voltages for the program operation, the erase operation, or the read operation of memory cells in response to the signals PGM, READ, ERASE, and RADD. The voltage supply circuit includes the voltage generator 130 and the row decoder 140.

The voltage generator 130 outputs operating voltages (for example, Vpgm, Vpass, and Vread) for programming, reading, or erasing memory cells to global lines in response to the signals PGM, READ, and ERASE.

The row decoder 140 transfers the operating voltages of the voltage generator 130 to the lines DSL, SSL, and WL0 to WLn of the memory cell block in response to the row address signal RADD.

The page buffer group 150 includes the page buffers PB that are each coupled a respective pair of the bit lines BLe and BLo. The page buffer group 150 supplies the bit lines BLe and BLo with voltages used to store data in the memory cells F0 to Fn in response to the page buffer signals PB SIGNALS. More particularly, in the program operation, the erase operation, or the read operation of the memory cells F0 to Fn, the page buffer group 150 precharges the bit lines BLe and BLo or stores data in the latches of the respective page buffers PB. In other words, in the program operation, the page buffer group 150 supplies a program permission voltage (for example, 0 V) or a program inhibition voltage (for example, Vcc) to the bit lines BLe and BLo. In the read operation, the page buffer group 150 detects data stored in the memory cells F0 to Fn by controlling the voltages of the bit lines BLe and BLo in response to data stored in the memory cells F0 to Fn.

The column selector 160 selects the page buffers PB in response to the column address signal CADD. Data stored in the latch of the page buffer PB selected by the column selector 160 is outputted.

The I/O circuit 170 transfers data DATA to the column selector 160 under the control of the controller 120 in a program operation, and the data DATA is inputted to the page buffers PB. When the data DATA is sequentially transferred to the page buffers PB, the page buffers PB store the data DATA in their latches. Furthermore, in a read operation, the I/O circuit 170 outputs data DATA received from the page buffers PB via the column selector 160.

The P/F check circuit 180 checks whether an error cell having a threshold voltage lower than a target voltage exists in programmed memory cells in a verify operation subsequent to a program operation and outputs the result of the check in the form of the check signal PFS. Furthermore, the P/F check circuit 180 counts the number of error cells and outputs the result of the count in the form of a count signal CS.

The controller 120 controls the program voltage Vpgm supplied to a word line in the program operation of memory cells coupled to the word line and also controls the voltage generator 130 so that verify voltages may be selectively supplied to a word line in a verify operation. In some embodiments, the controller 120 may control the voltage generator 130 in response to the check signal PFS of the P/F check circuit 180. Furthermore, in a verify operation, the controller 120 controls the duration of an evaluation operation by controlling the page buffer signals PB SIGNALS outputted to the page buffers PB so that the verify operation is performed before leakage is generated in the bit lines BLe and BLo.

Figure 2:
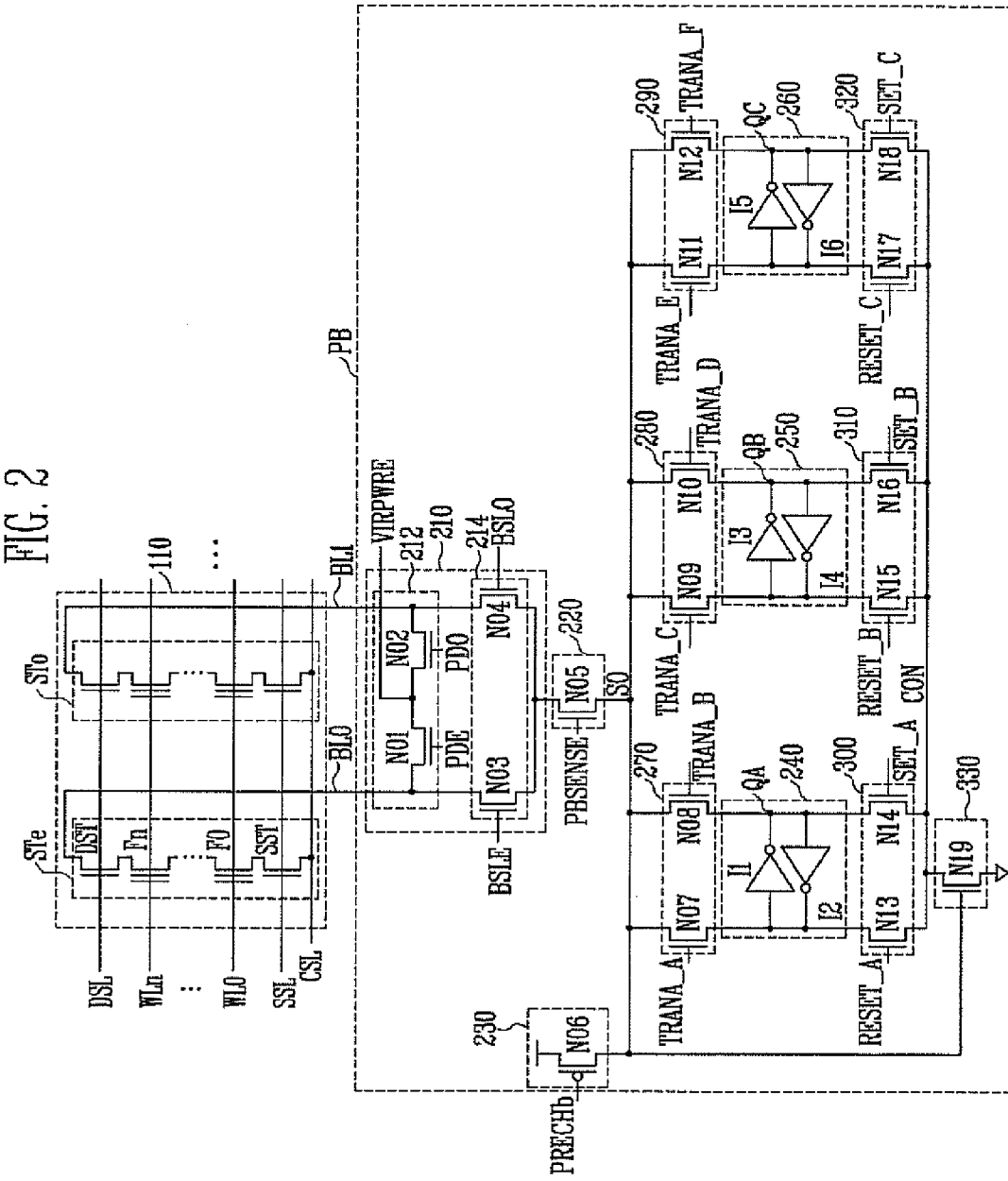
FIG. 2 is a detailed circuit diagram of a memory cell array and a page buffer shown in FIG. 1.

FIG. 2 is a detailed circuit diagram of the memory cell array 110 and the page buffer PB shown in FIG. 1.

Referring to FIG. 2, the memory cell array 110 includes the plurality of memory cell blocks as described above, and each of the memory cell blocks includes a plurality of even strings STe and a plurality of odd strings STo. One even string STe and one odd string STo included in one memory cell block are shown in FIG. 2, for illustration purposes.

The page buffer PB includes a bit line select circuit 210, a sense circuit 220, a precharge circuit 230, a first latch 240, a second latch 250, a third latch 260, a first transfer circuit 270, a second transfer circuit 280, a third transfer circuit 290, a first set/reset circuit 300, a second set/reset circuit 310, a third set/reset circuit 320, and a discharge circuit 330 configured to discharge a common node CON. The bit line select circuit 210 configured to select one of the bit lines BLe and BLo. The sense circuit 220 is configured to transfer the potential of a selected bit line to a sense node SO in a read operation. The precharge circuit 230 is configured to precharge the sense node SO. The first, second, and third latch 240, 250, and 260 are each configured to store data. The first transfer circuit 270 is configured to transfer data, stored in the first latch 240, to the sense node SO. The second transfer circuit 280 is configured to transfer data, stored in the second latch 250, to the sense node SO. The third transfer circuit 290 is configured to transfer data, stored in the third latch 260, to the sense node SO. The third transfer circuit 290 is configured to transfer data, stored in the third latch 260, to the sense node SO. The first set/reset circuit 300 is configured to set or reset the first latch 240. The second set/reset circuit 310 is configured to set or reset the second latch 250. The third set/reset circuit 320 is configured to set or reset the third latch 260. In addition, the discharge circuit 330 is configured to discharge a common node CON.

The bit line select circuit 210 includes a bit line precharge circuit 212 that precharges the even bit line BLe or the odd bit line BLo in a program operation and a select circuit 214 that selects the even bit line BLe or the odd bit line BLo.

The bit line precharge circuit 212 includes a first switch N01 that precharges the even bit line BLe in response to an even precharge signal PDE and a second switch N02 that precharges the odd bit line BLO in response to an odd precharge signal PDO. The first switch N01 is formed of an NMOS transistor coupled between the even bit line BLe and a terminal that supplies a virtual power VIRPERE. The second switch N02 is formed of an NMOS transistor coupled between the odd bit line BLo and the terminal that supplies the virtual power VIRPWRE.

The select circuit 214 includes a third switch N03 that selects the even bit line BLe in response to an even select signal BSLE and a fourth switch N04 that selects the odd bit line BLo in response to an odd select signal BSLO. Each of the third switch N03 and the fourth switch N04 is formed of an NMOS transistor.

The sense circuit 220 includes a fifth switch N05 that couples a selected bit line and the sense node SO in response to a sense signal PBSENSE. The fifth switch N05 is formed of an NMOS transistor.

The precharge circuit 230 includes a sixth switch N06. The sixth switch N06 precharges the sense node SO with a power source voltage VDD in response to a precharge signal PRECHb. The sixth switch 230 is coupled to a terminal that supplies the power source voltage VDD and the sense node. The sixth switch N06 is formed of a PMOS transistor.

The first latch 240 includes first and second inverters I1 and I2. The output terminal of the first inverter I1 is coupled to the input terminal of the second inverter I2, and the output terminal of the second inverter I2 is coupled to the input terminal of the first inverter I1. Data QA stored in the first latch 240 is determined by a potential at the output terminal of the first inverter. For example, when the potential at the output terminal of the first inverter I1 is a high level, the data QA of the first latch 240 becomes '1'. When the potential at the output terminal of the first inverter I1 is a low level, the data QA of the first latch 240 becomes '0'.

The second latch 250 includes third and fourth inverters I3 and I4. The output terminal of the third inverter I3 is coupled to the input terminal of the fourth inverter I4, and the output terminal of the fourth inverter I4 is coupled to the input terminal of the third inverter I1 Data QB stored in the second latch 250 is determined by a potential at the output terminal of the third inverter I3. For example, when the potential at the output terminal of the third inverter I3 is a high level, the data QB of the second latch 250 becomes '1'. When the potential at the output terminal of the third inverter I3 is a low level, the data QB of the second latch 250 becomes '0'.

The third latch 260 includes fifth and sixth inverters I5 and I6. The output terminal of the fifth inverter I5 is coupled to the input terminal of the sixth inverter I6, and the output terminal of the sixth inverter I6 is coupled to the input terminal of the fifth inverter I5. Data QC stored in the third latch 260 is determined by a potential at the output terminal of the fifth inverter I5. For example, when a potential at the output terminal of the fifth inverter I5 is a high level, the data QC of the third latch 260 becomes '1'. When the potential at the output terminal of the fifth inverter I5 is a low level, the data QC of the third latch 260 becomes '0'. The page buffer PB of FIG. 2 is illustrated to include the three latches 240 to 260, but the page buffer PB may include more than three latches.

The first transfer circuit 270 includes a seventh switch N07 that couples the input terminal of the first inverter I1 and the sense node SO in response to a first transfer signal TRANA_A and an eighth switch N08 that couples the output terminal of the first inverter I1 and the sense node SO in response to a second transfer signal TRANA_B. The seventh and the eighth switches N07 and N08 are each formed of an NMOS transistor.

The second transfer circuit 280 includes a ninth switch N09 that couples the input terminal of the third inverter I3 and the sense node SO in response to a third transfer signal TRANA_C and a tenth switch N10 that couples the output terminal of the third inverter I3 and the sense node SO in response to a fourth transfer signal TRANA_D. The ninth and the tenth switches N09 and N10 are each formed of an NMOS transistor.

The third transfer circuit 290 includes an eleventh switch N11 that couples the input terminal of the fifth inverter I5 and the sense node SO in response to a fifth transfer signal TRANA_E and a twelfth switch N12 that couples the output terminal of the fifth inverter I5 and the sense node SO in response to a sixth transfer signal TRANA_F. The eleventh and the twelfth switches N11 and N12 are each formed of an NMOS transistor.

The first set/reset circuit 300 includes a thirteenth switch N13 that resets the first latch 240 by coupling the output terminal of the second inverter I2 and the common node CON in response to a first reset signal RESET_A and a fourteenth switch N14 that sets the first latch 240 by coupling the input terminal of the second inverter I2 and the common node CON in response to a first set signal SET_A. The thirteenth and the fourteenth switches N13 and N14 are each formed of an NMOS transistor.

The second set/reset circuit 310 includes a fifteenth switch N15 that resets the second latch 250 by coupling the output terminal of the fourth inverter I4 and the common node CON in response to a second reset signal RESET_B and a sixteenth switch N16 that sets the second latch 250 by coupling the input terminal of the fourth inverter I4 and the common node CON in response to a second set signal SET_B. The fifteenth and the sixteenth switches N15 and N16 are each formed of an NMOS transistor.

The third set/reset circuit 320 includes a seventeenth switch N17 that resets the third latch 260 by coupling the output terminal of the sixth inverter I6 and the common node CON in response to a third reset signal RESET_C and an eighth switch N18 that sets the third latch 260 by coupling the input terminal of the sixth inverter I6 and the common node CON in response to a third set signal SET_C. The seventeenth and the eighteenth switches N17 and N18 are each formed of an NMOS transistor.

The discharge circuit 330 includes a nineteenth switch N19 that discharges the common node CON by coupling the common node CON and a ground terminal Vss in response to a potential of the sense node SO. The nineteenth switch N19 is formed of an NMOS transistor.

Figure 3:
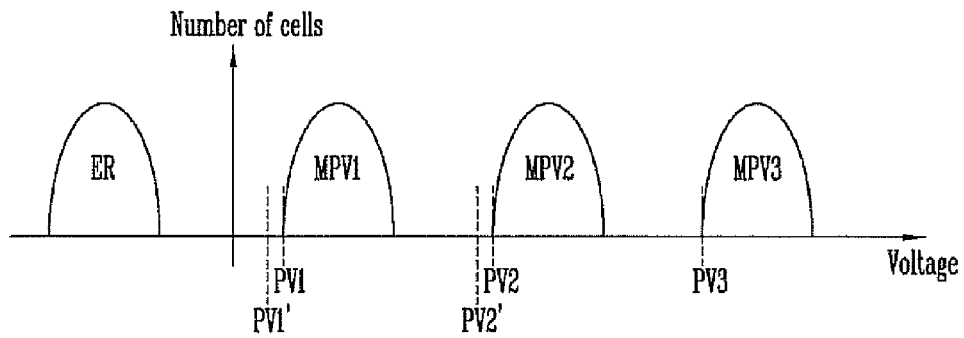
FIG. 3 is a graph illustrating the threshold voltages of an MLC.

FIG. 3 is a graph illustrating the threshold voltages of an MLC.

An example of a memory cell that is programmed with three different levels is described below with reference to FIG. 3. The memory cell is in an erase state ER when it has a threshold voltage lower than 0 V and is in a program state MPV1, MPV2, or MPV3 when it has a threshold voltage higher than 0 V.

The program states are classified into the first state MPV1, the second state MPV2 higher than the first state MPV1, and the third state MPV3 higher than the second state MPV2 according to a threshold voltage level. In the first state MPV1, each of the threshold voltages of memory cells has reached a first target voltage PV1. In the second state MPV2, each of the threshold voltages of memory cells has reached a second target voltage PV2 higher than the first target voltage PV1. In the third state MPV3, each of the threshold voltages of memory cells has reached a third target voltage PV3 higher than the second target voltage PV2.

A program operation is performed in accordance with an incremental step pulse program (ISPP) method that gradually raises a program pulse supplied to a selected word line. The program and verify operations are repeated while gradually raising the program pulse until the threshold voltages of all memory cells coupled to the selected word line reach the first, second, or third target voltage PV1, PV2, or PV3.

A verify operation of a method of programming memory cells is described in detail below.

Figure 4:
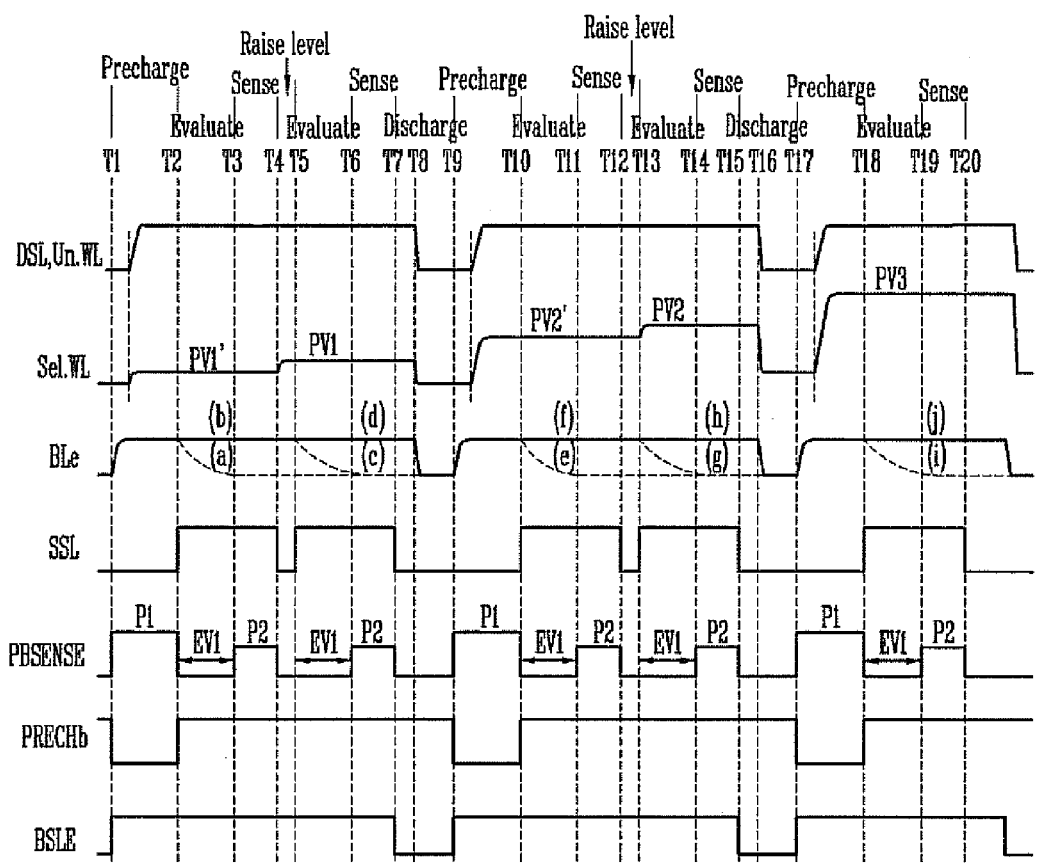
FIG. 4 is a timing diagram illustrating a verify operation according to a first embodiment of this disclosure.

FIG. 4 is a timing diagram illustrating a verify operation according to a first embodiment of this disclosure. Signals in FIG. 4 are described with reference to the signals of FIG. 2, and voltage levels in FIG. 4 are described with reference to the voltage levels of FIG. 3.

Referring to FIG. 4, after the program voltage is supplied to a selected word line, a verify operation is performed (T1 to T20).

(T1 to T2) A bit line is precharged.

A verify operation is performed on memory cells to be programmed in the first state MPV1.

More specifically, the sense node SO is precharged in response to the precharge signal PRECHb of a low level. The precharged sense node SO and the even bit line BLe are coupled in response to the sense signal PBSENSE of a high level and the even select signal BSLE of a high level, and as a result, the even bit line BLe is precharged. The sense signal PBSENSE has a first voltage P1 to precharge the even bit line BLe. After the even bit line BLe is precharged, a turn-on voltage is supplied to the drain select line DSL, and a first verify voltage PV1' is supplied to a selected word line Sel.WL to couple the strings STe and STo to the precharged bit line BLe. The first verify voltage PV1' is lower than the first target voltage PV1 (more specifically, the target level of the first state MPV1) to narrow the width of a distribution of the threshold voltages of the memory cells that are coupled to the selected word line Sel.WL and that will be programmed in the first state MPV1. When the first verify voltage PV1' is supplied to the selected word line Sel.WL, the pass voltage Vpass is supplied to the unselected word lines Un.WL other than the selected word line Sel.WL.

(T2 to T3) An evaluation operation that evaluates if the state of a selected memory cell is outputted into bit lines is performed.

The precharging of the sense node SO is stopped in response to the precharge signal PRECHb of a high level, and the sense node SO and the even bit line BLe are electrically disconnected in response to the sense signal PBSENSE of a low level. In order to incorporate the state of a selected memory cell to the bit lines, the turn-on voltage of a high level is supplied to the source select line SSL. When the turn-on voltage is supplied to the source select line SSL, the source select transistor SST is turned on, and the common source line CSL having the ground level is coupled to the string STe or STo coupled to the selected memory cell. When the threshold voltage of the selected memory cell is lower than the first verify voltage PV1', the common source line CSL having the ground level is coupled to the even bit line BLe because a channel is formed in the entire even string STe, and the potential of the even bit line BLe is lowered (a). If the threshold voltage of the selected memory cell is higher than the first verify voltage PV1', the precharge level of the even bit line BLe does not drop because a channel is not formed in the selected memory cell (b). The evaluation operation T2 to T3 is performed during a first time EV1.

(T3 to T4) A potential of the bit line is sensed.

A potential of the even bit line BLe, which has the state of the selected memory cell outputted (or incorporated) to it, is detected by supplying the sense signal PBSENSE having a second voltage P2 lower than the first voltage P1. More specifically, when the third switch N03 is turned on, the fifth switch N05 is turned on in response to the sense signal PBSENSE of a high level, and the potential of the even bit line BLe, which has the state of the selected memory cell outputted to it, is transferred to the sense node SO. If the even bit line BLe maintains a precharge level (b) (more specifically, the threshold voltage of the selected memory cell has reached the first verify voltage PV1'), the voltage of the sense node SO maintains a high level. If the potential of the even bit line BLe is lower than the precharge level (a) (more specifically, the threshold voltage of the selected memory cell has not reached the first verify voltage PV1'), the voltage of the sense node SO shifts to a low level. Whether the threshold voltage of the selected memory cell is higher or lower than the first verify voltage PV1' is determined by sensing the changed potential of the sense node SO.

(T4 to T5) The level of voltage supplied to the selected word line is raised.

More specifically, the fifth switch N05 and the source select transistor SST are turned off (T4) by supplying the sense signal PBSENSE of a low level and supplying voltage of a low level to the source select line SSL. In order to verify whether the threshold voltages of the memory cells to be programmed in the first state MPV1 have reached the first target voltage PV1 (more specifically, the target level of the first state MPV1), the first target voltage PV1 is supplied to the selected word line Sel.WL.

(T5 to T6) An evaluation operation that evaluates if the state of the selected memory cell is incorporated to the bit lines is performed.

In order to incorporate the state of the selected memory cell to the bit lines, the turn-on voltage of a high level is supplied to the source select line SSL. When the turn-on voltage is supplied to the source select line SSL, the source select transistor SST is turned on, and the common source line CSL having the ground level is coupled to the strings STe or STo. When the threshold voltage of the selected memory cell is lower than the first target voltage PV1, the common source line CSL having the ground level is coupled to the even bit line BLe because a channel is formed in the entire even string STe, and the potential of the even bit line BLe is lowered (c). If the threshold voltage of the selected memory cell is higher than the first target voltage PV1, the precharge level of the even bit line BLe does not drop because a channel is not formed in the selected memory cell (d). The evaluation operation T5 to T6 is performed during the first time EV1.

(T6 to T7) A potential of the bit line is sensed.

A potential of the even bit line BLe, which has the state of the selected memory cell incorporated into it, is sensed by supplying the fifth switch N05 with the sense signal PBSENSE having the second voltage P2. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the voltage of the even bit line BLe maintains the precharge level (d) (more specifically, if the threshold voltage of the selected memory cell has reached the first target voltage PV1), the voltage of the sense node SO maintains a high level. If the voltage of the even bit line BLe has shifted to a level lower than the precharge level (c) (more specifically, if the threshold voltage of the selected memory cell has not reached the first target voltage PV1), the voltage of the sense node SO shifts a low level. Whether the threshold voltage of the selected memory cell has reached the first target voltage PV1 or not is determined by sensing the changed potential of the sense node SO.

(T7 to T9) The bit lines and the word lines are discharged.

After the voltage of a high level supplied to the source select line SSL shifts to a low level and the sense signal PBSENSE and the even select signal BSLE both having a low level are supplied (T7), all the word lines Sel.WL and Un.WL and the drain select line DSL are discharged (T8 to T9).

(T9 to T10) A bit line is precharged.

A verify operation is performed on memory cells to be programmed in the second state MPV2.

More specifically, the sense node SO is precharged in response to the precharge signal PRECHb of a low level, and the precharged sense node SO is coupled to the even bit line BLe in response to the sense signal PBSENSE of a high level and the even select signal BSLE of a high level, and the even bit line BLe is precharged. Here, the sense signal PBSENSE having the first voltage P1 is supplied to precharge the even bit line BLe. Next, to couple the string STe or STo to the precharged bit line BLe, the turn-on voltage is supplied to the drain select line DSL and the second verify voltage PV2' is supplied to the selected word line Sel.WL. In order to narrow the width of a distribution of the threshold voltages of the memory cells to be programmed in the second state MPV2, the second verify voltage PV2' is lower than the second target voltage PV2 (more specifically, the target level of the second state MPV2), but the second verify voltage PV2' is higher than the first target voltage PV1. When the second verify voltage PV2' is supplied to the selected word line Sel.WL, the pass voltage Vpass is supplied to the unselected word lines Un.WL other than the selected word line Sel.WL.

(T10 to T11) An evaluation operation of incorporating the state of a selected memory cell to the bit lines is performed.

The precharging of the sense node SO is stopped in response to the precharge signal PRECHb of a high level, and the sense node SO and the even bit line BLe are electrically disconnected in response to the sense signal PBSENSE of a low level. In order to incorporate the state of a selected memory cell to the bit lines, the turn-on voltage of a high level is supplied to the source select line SSL. When the turn-on voltage is supplied to the source select line SSL, the source select transistor SST is turned on, and thus, the common source line CSL having the ground level and the string STe or STo are coupled. When the threshold voltage of the selected memory cell is lower than the second verify voltage PV2', the common source line CSL having the ground level is coupled to the even bit line BLe because a channel is formed in the entire even string STe, and the potential of the even bit line BLe is lowered (e). When the threshold voltage of the selected memory cell is higher than the second verify voltage PV2', the precharge level of the even bit line BLe does not drop because a channel is not formed in the selected memory cell (f). The evaluation operation T10 to T11 is performed during the first time EV1.

(T11 to T12) A potential of the bit line is sensed.

The potential of the even bit line BLe, which has the state of the selected memory cell incorporated into it, is sensed by supplying the sense signal PBSENSE having the second voltage P2 lower than the first voltage P1. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the voltage of the even bit line BLe maintains the precharge level (f) (more specifically, the threshold voltage of the selected memory cell has reached the second verify voltage PV2'), the voltage of the sense node SO maintains a high level. If the voltage of the even bit line BLe has shifted to a level lower than the precharge level (e) (more specifically, the threshold voltage of the selected memory cell has not reached the second verify voltage PV2'), the voltage of the sense node SO shifts to a low level. Whether the threshold voltage of the selected memory cell is lower or higher than the second verify voltage PV2' is determined by sensing the changed potential of the sense node SO.

(T12 to T13) The level of voltage supplied to the selected word line is raised.

More specifically, the fifth switch N05 and the source select transistor SST are turned off by supplying the sense signal PBSENSE of a low level and supplying voltage of a low level to the source select line SSL (T4). Next, to verify whether the threshold voltages of the memory cells to be programmed in the second state MPV2 the second target voltage PV2 (more specifically, the target level of the second state MPV2), the second target voltage PV2 is supplied to the selected word line Sel.WL.

(T13 to T14) An evaluation operation that evaluates if the state of the selected memory cell is incorporated to the bit lines is performed.

In order to incorporate the state of the selected memory cell to the bit lines, the turn-on voltage of a high level is supplied to the source select line SSL. When the turn-on voltage is supplied to the source select line SSL, the source select transistor SST is turned on, and thus, the common source line CSL having the ground level is coupled to the string STe or STo. When the threshold voltage of the selected memory cell is lower than the second target voltage PV2, the common source line CSL having the ground level is coupled to the even bit line BLe because a channel is formed in the entire even string STe, and the potential of the even bit line BLe is lowered (g). If the threshold voltage of the selected memory cell is higher than the second target voltage PV2, the precharge level of the even bit line BLe does not drop because a channel is not formed in the selected memory cell (h). The evaluation operation T13 to T14 is performed during the first time EV1.

(T14 to T15) A potential of the bit line is sensed.

A potential of the even bit line BLe, which has the state of the selected memory cell incorporated into it, is sensed by supplying the fifth switch N05 with the sense signal PBSENSE having the second voltage P2. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the voltage of the even bit line BLe maintains the precharge level (h) (more specifically, if the threshold voltage of the selected memory cell has reached the second target voltage PV2), the voltage of the sense node SO maintains a high level. If the voltage of the even bit line BLe has shifted to a level lower than the precharge level (g) (more specifically, if the threshold voltage of the selected memory cell has not reached the second target voltage PV2), the voltage of the sense node SO shifts to a low level. Whether the threshold voltage of the selected memory cell has reached the second target voltage PV2 or not is determined by sensing the changed potential of the sense node SO.

(T15 to T17) The bit lines and the word lines are discharged.

After the voltage supplied to the source select line SSL shifts to a low level and the sense signal PBSENSE and the even select signal BSLE both having a low level are supplied (T15), all the word lines Sel.WL and Un.WL and the drain select line DSL are discharged.

(T17 to T18) A bit line is precharged.

A verify operation is performed on memory cells to be programmed in the third state MPV3.

More specifically, the sense node SO is precharged in response to the precharge signal PRECHb of a low level, and the precharged sense node SO is coupled to the even bit line BLe in response to the sense signal PBSENSE of a high level and the even select signal BSLE of a high level, thereby precharging the even bit line BLe. In order to precharge the even bit line BLe, the sense signal PBSENSE having the first voltage P1 is supplied. Next, the turn-on voltage is supplied to the drain select line DSL to couple the strings STe and STo and the precharged bit line BLe, and the third target voltage PV3 higher than the second target voltage PV2 is supplied to the selected word line Sel.WL.

(T18 to T19) An evaluation operation that evaluates if the state of the selected memory cell is incorporated to the bit lines is performed.

In order to incorporate the state of the selected memory cells to the bit lines, the turn-on voltage of a high level is supplied to the source select line SSL. When the turn-on voltage is supplied to the source select line SSL, the source select transistor SST is turned on, and thus, the common source line CSL having the ground level is coupled to the string STe or STo. When the threshold voltage of the selected memory cell is lower than the third target voltage PV3, the common source line CSL having the ground level is coupled to the even bit line BLe because a channel is formed in the entire even string STe, and the potential of the even bit line BLe is lowered (i). If the threshold voltage of the selected memory cell is higher than the third target voltage PV3, the precharge level of the even bit line BLe does not drop because a channel is not formed in the selected memory cell (j). The evaluation operation T18 to T19 is performed during the first time EV1.

(T19 to T20) A potential of the bit line is sensed.

A potential of the even bit line BLe, which has the state of the selected memory cell incorporated into it, is sensed by supplying the fifth switch N05 with the sense signal PBSENSE having the second voltage P2. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the voltage of the even bit line BLe maintains the precharge level (j) (more specifically, if the threshold voltage of the selected memory cell has reached the third target voltage PV3), the voltage of the sense node SO maintains a high level. If the voltage of the even bit line BLe has shifted to a level lower than the precharge level (i) (more specifically, if the threshold voltage of the selected memory cell has not reached the third target voltage PV3), the voltage of the sense node SO shifts to a low level. Whether the threshold voltage of the selected memory cell has reached the third target voltage PV3 or not is determined by sensing the changed potential of the sense node SO.

Next, after the voltage supplied to the source select line SSL shifts to a low level and the sense signal PBSENSE and the even select signal BSLE both having a low level are supplied, all the word lines Sel.WL and Un.WL and the drain select line DSL are discharged.

Figure 5:
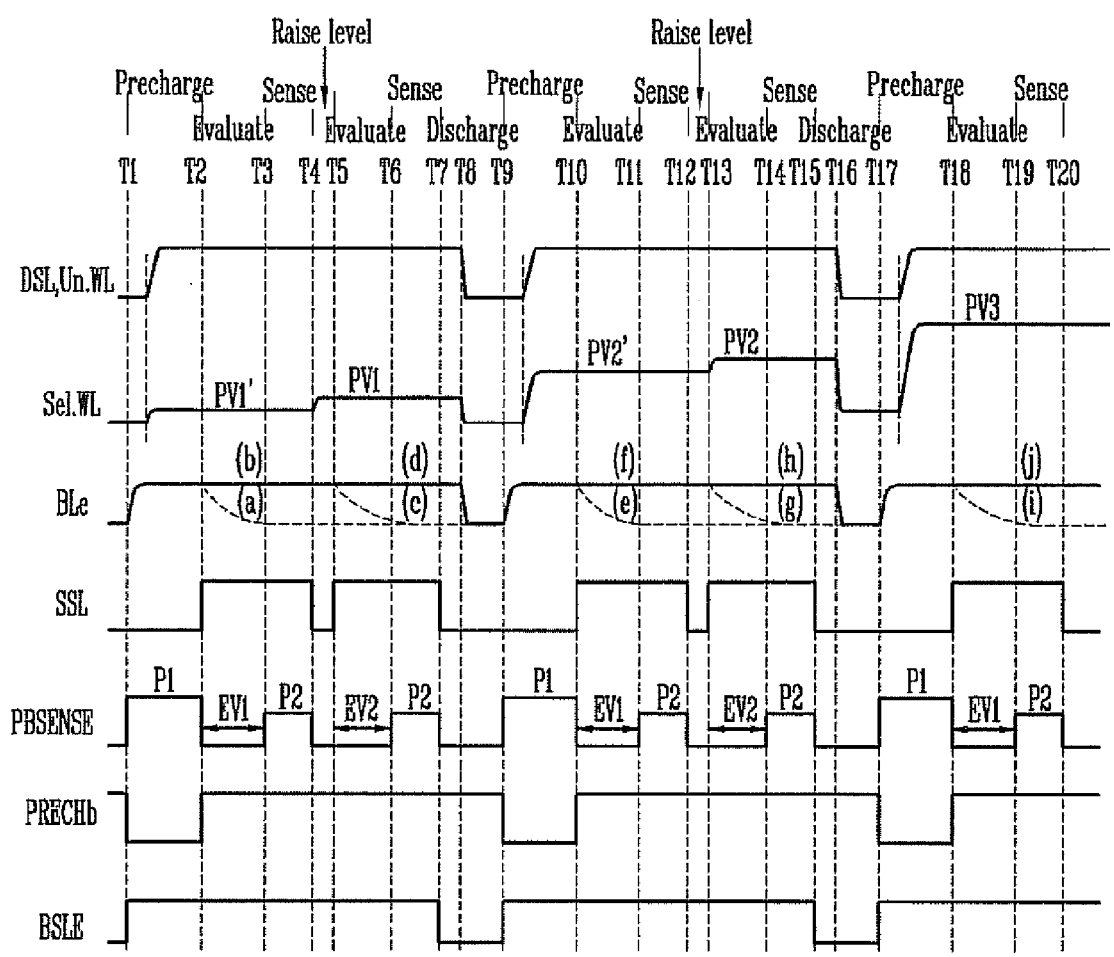
FIG. 5 is a timing diagram illustrating a verify operation according to a second embodiment of this disclosure.

FIG. 5 is a timing diagram illustrating a verify operation according to a second embodiment of this disclosure.

Referring to FIG. 5, after the program voltage Vpgm is supplied to a selected word line, a verify operation T1 to T20 is performed.

(T1 to T2) A bit line is precharged.

A verify operation is performed on memory cells to be programmed in the first state MPV1.

More specifically, the sense node SO is precharged in response to the precharge signal PRECHb of a low level. The precharged sense node SO and the even bit line BLe are coupled in response to the sense signal PBSENSE of a high level and the even select signal BSLE of a high level, and as a result, the even bit line BLe is precharged. The sense signal PBSENSE has a first voltage P1 to precharge the even bit line BLe. After the even bit line BLe is precharged, a turn-on voltage is supplied to the drain select line DSL, and a first verify voltage PV1' is supplied to a selected word line Sel.WL in to couple the strings STe and STo to the precharged bit line BLe. The first verify voltage PV1' is lower than the first target voltage PV1 (more specifically, the target level of the first state MPV1) to narrow the width of a distribution of the threshold voltages of the memory cells that are coupled to the selected word line Sel.WL and that will be programmed in the first state MPV1. When the first verify voltage PV1' is supplied to the selected word line Sel.WL, the pass voltage Vpass is supplied to the unselected word lines Un.WL other than the selected word line Sel.WL.

(T2 to T3) An evaluation operation that evaluates if the state of a selected memory cell is incorporated to the bit lines is performed.

The precharging of the sense node SO is stopped in response to the precharge signal PRECHb of a high level, and the sense node SO and the even bit line BLe are electrically disconnected in response to the sense signal PBSENSE of a low level. In order to incorporate the state of a selected memory cell to the bit lines, the turn-on voltage of a high level is supplied to the source select line SSL. When the turn-on voltage is supplied to the source select line SSL, the source select transistor SST is turned on, and the common source line CSL having the ground level is coupled to the string STe or STo coupled to the selected memory cell. When the threshold voltage of the selected memory cell is lower than the first verify voltage PV1', the common source line CSL having the ground level is coupled to the even bit line BLe because a channel is formed in the entire even string STe, and the potential of the even bit line BLe is lowered (a). If the threshold voltage of the selected memory cell is higher than the first verify voltage PV1', the precharge level of the even bit line BLe does not drop because a channel is not formed in the selected memory cell (b). The evaluation operation T2 to T3 is performed during a first time EV1.

(T3 to T4) A potential of the bit line is sensed.

The potential of the even bit line BLe, which have the state of the selected memory cell incorporated into it, is detected by supplying the sense signal PBSENSE having a second voltage P2 lower than the first voltage P1. More specifically, when the third switch N03 is turned on, the fifth switch N05 is turned on in response to the sense signal PBSENSE of a high level, and the potential of the even bit line BLe, which have the state of the selected memory cell incorporated into it, is transferred to the sense node SO. If the even bit line BLe maintains a precharge level (b) (more specifically, the threshold voltage of the selected memory cell has reached the first verify voltage PV1'), the voltage of the sense node SO maintains a high level. If the potential of the even bit line BLe is lower than the precharge level (a) (more specifically, the threshold voltage of the selected memory cell has not reached the first verify voltage PV1'), the voltage of the sense node SO shifts to a low level. Whether the threshold voltage of the selected memory cell is higher or lower than the first verify voltage PV1' is determined by sensing the changed potential of the sense node SO.

(T4 to T5) The level of voltage supplied to the selected word line is raised.

More specifically, the fifth switch N05 and the source select transistor SST are turned off (T4) by supplying the sense signal PBSENSE of a low level and supplying voltage of a low level to the source select line SSL. In order to verify whether the threshold voltages of the memory cells to be programmed in the first state MPV1 have reached the first target voltage PV1 (more specifically, the target level of the first state MPV1), the first target voltage PV1 is supplied to the selected word line Sel.WL.

(T5 to T6) An evaluation operation that evaluates if the state of the selected memory cell is incorporated to the bit lines is performed.

In order to incorporate the state of the selected memory cell to the bit lines, the turn-on voltage of a high level is supplied to the source select line SSL. When the turn-on voltage is supplied to the source select line SSL, the source select transistor SST is turned on, and the common source line CSL having the ground level is coupled to the strings STe or STo. When the threshold voltage of the selected memory cell is lower than the first target voltage PV1, the common source line CSL having the ground level is coupled to the even bit line BLe because a channel is formed in the entire even string STe, and the potential of the even bit line BLe is lowered (c). If the threshold voltage of the selected memory cell is higher than the first target voltage PV1, the precharge level of the even bit line BLe does not drop because a channel is not formed in the selected memory cell (d). The evaluation operation T5 to T6 is performed during a second time EV2 shorter than the first time EV1.

The time for the evaluation operation T5 to T6 is reduced to incorporate the state of the selected memory cell into the even bit line BLe before the threshold voltage of the selected memory cell falls below the first target voltage PV1 when the precharge level of the precharged even bit line BLe is lowered by leakage. Particularly, the leakage of the precharged even bit line BLe is generated when the source select transistor SST is turned when the common source line CSL is grounded. Accordingly, the time for the evaluation operation T5 to T6 may be controlled by changing a point in time T5 when the turn-on voltage is supplied to the source select line SSL or a point in time T6 when the sense signal PBSENSE shifts to a high level. More specifically, in order to reduce the time for the evaluation operation T5 to T6, the point in time T5 when the turn-on voltage is supplied to the source select line SSL may be delayed, or the point in time T6 when the sense signal PBSENSE shifts to a high level may be shortened. The point in time T5 when the turn-on voltage is supplied to the source select line SSL is preferrably delayed. If the point in time T5 when the turn-on voltage is supplied to the source select line SSL is delayed, the leakage of the even bit line BLe is measured, and the point in time T5 when the turn-on voltage is supplied to the source select line SSL is controlled such that the potential of the precharged even bit line BLe lowered according to the measured leakage does not reach a verify voltage or a target voltage used in a verify operation.

(T6 to T7) A potential of the bit line is sensed.

A potential of the even bit line BLe, which has the state of the selected memory cell incorporated into it, is sensed by supplying the fifth switch N05 with the sense signal PBSENSE having the second voltage P2. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the voltage of the even bit line BLe maintains the precharge level (d) (more specifically, if the threshold voltage of the selected memory cell has reached the first target voltage PV1), the voltage of the sense node SO maintains a high level. If the voltage of the even bit line BLe has shifted to a level lower than the precharge level (c) (more specifically, if the threshold voltage of the selected memory cell has not reached the first target voltage PV1), the voltage of the sense node SO shifts a low level. Whether the threshold voltage of the selected memory cell has reached the first target voltage PV1 or not is determined by sensing the changed potential of the sense node SO.

(T7 to T9) The bit lines and the word lines are discharged.

After the voltage of a high level supplied to the source select line SSL shifts to a low level and the sense signal PBSENSE and the even select signal BSLE both having a low level are supplied (T7), all the word lines Sel.WL and Un.WL and the drain select line DSL are discharged (T8 to T9).

(T9 to T10) A bit line is precharged.

A verify operation is performed on memory cells to be programmed in the second state MPV2.

More specifically, the sense node SO is precharged in response to the precharge signal PRECHb of a low level, and the precharged sense node SO is coupled to the even bit line BLe in response to the sense signal PBSENSE of a high level and the even select signal BSLE of a high level, and the even bit line BLe is precharged. Here, the sense signal PBSENSE having the first voltage P1 is supplied to precharge the even bit line BLe. Next, to couple the string STe or STo and the precharged bit line BLe, the turn-on voltage is supplied to the drain select line DSL and the second verify voltage PV2' is supplied to the selected word line Sel.WL. In order to narrow the width of a distribution of the threshold voltages of the memory cells to be programmed in the second state MPV2, the second verify voltage PV2' is lower than the second target voltage PV2 (more specifically, the target level of the second state MPV2), but the second verify voltage PV2' is higher than the first target voltage PV1. When the second verify voltage PV2' is supplied to the selected word line Sel.WL, the pass voltage Vpass is supplied to the unselected word lines Un.WL other than the selected word line Sel.WL.

(T10 to T11) An evaluation operation that evaluates if the state of a selected memory cell is incorporated to the bit lines is performed.

The precharging of the sense node SO is stopped in response to the precharge signal PRECHb of a high level, and the sense node SO and the even bit line BLe are electrically disconnected in response to the sense signal PBSENSE of a low level. In order to incorporate the state of a selected memory cell to the bit lines, the turn-on voltage of a high level is supplied to the source select line SSL. When the turn-on voltage is supplied to the source select line SSL, the source select transistor SST is turned on, and thus, the common source line CSL having the ground level and the string STe or STo are coupled. When the threshold voltage of the selected memory cell is lower than the second verify voltage PV2', the common source line CSL having the ground level is coupled to the even bit line BLe because a channel is formed in the entire even string STe, and the potential of the even bit line BLe is lowered (e). When the threshold voltage of the selected memory cell is higher than the second verify voltage PV2', the precharge level of the even bit line BLe does not drop because a channel is not formed in the selected memory cell (f). The evaluation operation T10 to T11 is performed during the first time EV1.

(T11 to T12) A potential of the bit line is sensed.

A potential of the even bit line BLe, which has the state of the selected memory cell incorporated into it, is sensed by supplying the sense signal PBSENSE having the second voltage P2 lower than the first voltage P1. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the voltage of the even bit line BLe maintains the precharge level (f) (more specifically, the threshold voltage of the selected memory cell has reached the second verify voltage PV2'), the voltage of the sense node SO maintains a high level. If the voltage of the even bit line BLe has shifted to a level lower than the precharge level (e) (more specifically, the threshold voltage of the selected memory cell has not reached the second verify voltage PV2'), the voltage of the sense node SO shifts to a low level. Whether the threshold voltage of the selected memory cell is lower or higher than the second verify voltage PV2' is determined by sensing the changed potential of the sense node SO.

(T12 to T13) The level of voltage supplied to the selected word line is raised.

More specifically, the fifth switch N05 and the source select transistor SST are turned off by supplying the sense signal PBSENSE of a low level and supplying voltage of a low level to the source select line SSL (T4). Next, to verify whether the threshold voltages of the memory cells to be programmed in the second state MPV2 the second target voltage PV2 (more specifically, the target level of the second state MPV2), the second target voltage PV2 is supplied to the selected word line Sel.WL.

(T13 to T14) An evaluation operation that evaluates if the state of the selected memory cell is incorporated to the bit lines is performed.

In order to incorporate the state of the selected memory cell to the bit lines, the turn-on voltage of a high level is supplied to the source select line SSL. When the turn-on voltage is supplied to the source select line SSL, the source select transistor SST is turned on, and thus, the common source line CSL having the ground level is coupled to the string STe or STo. When the threshold voltage of the selected memory cell is lower than the second target voltage PV2, the common source line CSL having the ground level is coupled to the even bit line BLe because a channel is formed in the entire even string STe, and the potential of the even bit line BLe is lowered (g). If the threshold voltage of the selected memory cell is higher than the second target voltage PV2, the precharge level of the even bit line BLe does not drop because a channel is not formed in the selected memory cell (h). Like the evaluation operation T5 to T6, the evaluation operation T13 to T14 is performed during the second time EV2. In order to reduce the time for the evaluation operation T13 to T14 to the second time EV2, a point in time T13 when the turn-on voltage is supplied to the source select line SSL may be delayed, or a point in time T14 when the sense signal PBSENSE shifts to a high level may be shortened. The point in time T13 when the turn-on voltage is supplied to the source select line SSL is preferably delayed. If the point in time T13 when the turn-on voltage is supplied to the source select line SSL is delayed, the leakage of the even bit line BLe is measured, and the point in time T13 when the turn-on voltage is supplied to the source select line SSL is controlled so that the potential of the precharged even bit line BLe, lowered according to the measured leakage, does not reach a verify voltage or a target voltage used in a verify operation.

(T14 to T15) A potential of the bit line is sensed.

A potential of the even bit line BLe, which has the state of the selected memory cell incorporated into it, is sensed by supplying the fifth switch N05 with the sense signal PBSENSE having the second voltage P2. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the voltage of the even bit line BLe maintains the precharge level (h) (more specifically, if the threshold voltage of the selected memory cell has reached the second target voltage PV2), the voltage of the sense node SO maintains a high level. If the voltage of the even bit line BLe has shifted to a level lower than the precharge level (g) (more specifically, if the threshold voltage of the selected memory cell has not reached the second target voltage PV2), the voltage of the sense node SO shifts to a low level. Whether the threshold voltage of the selected memory cell has reached the second target voltage PV2 or not is determined by sensing the changed potential of the sense node SO.

(T15 to T17) The bit lines and the word lines are discharged.

After the voltage supplied to the source select line SSL shifts to a low level and the sense signal PBSENSE and the even select signal BSLE both having a low level are supplied (T15), all the word lines Sel.WL and Un.WL and the drain select line DSL are discharged.

(T17 to T18) The bit line is precharged.

A verify operation is performed on memory cells to be programmed in the third state MPV3.

More specifically, the sense node SO is precharged in response to the precharge signal PRECHb of a low level, and the precharged sense node SO is coupled to the even bit line BLe in response to the sense signal PBSENSE of a high level and the even select signal BSLE of a high level, thereby precharging the even bit line BLe. In order to precharge the even bit line BLe, the sense signal PBSENSE having the first voltage P1 is supplied. Next, the turn-on voltage is supplied to the drain select line DSL to couple the strings STe and STo and the precharged bit line BLe, and the third target voltage PV3 higher than the second target voltage PV2 is supplied to the selected word line Sel.WL.

(T18 to T19) An evaluation operation that evaluates if the state of the selected memory cell is incorporated to the bit lines is performed.

In order to incorporate the state of the selected memory cells to the bit lines, the turn-on voltage of a high level is supplied to the source select line SSL. When the turn-on voltage is supplied to the source select line SSL, the source select transistor SST is turned on, and thus, the common source line CSL having the ground level is coupled to the string STe or STo. When the threshold voltage of the selected memory cell is lower than the third target voltage PV3, the common source line CSL having the ground level is coupled to the even bit line BLe because a channel is formed in the entire even string STe, and the potential of the even bit line BLe is lowered (i). If the threshold voltage of the selected memory cell is higher than the third target voltage PV3, the precharge level of the even bit line BLe does not drop because a channel is not formed in the selected memory cell (j). The evaluation operation T18 to T19 is performed during the first time EV1.

(T19 to T20) A potential of the bit line is sensed.

A potential of the even bit line BLe, which has the state of the selected memory cell incorporated into it, is sensed by supplying the fifth switch N05 with the sense signal PBSENSE having the second voltage P2. More specifically, when the third switch N03 is turned on, the fifth switch N05 is turned on in response to the sense signal PBSENSE of a high level, and the potential of the even bit line BLe, which has the state of the selected memory cell incorporated into it is transferred to the sense node SO. If the voltage of the even bit line BLe maintains the precharge level (j) (more specifically, if the threshold voltage of the selected memory cell has reached the third target voltage PV3), the voltage of the sense node SO maintains a high level. If the voltage of the even bit line BLe has shifted to a level lower than the precharge level (i) (more specifically, if the threshold voltage of the selected memory cell has not reached the third target voltage PV3), the voltage of the sense node SO shifts to a low level. Whether the threshold voltage of the selected memory cell has reached the third target voltage PV3 or not is determined by sensing the changed potential of the sense node SO.

Next, after the voltage supplied to the source select line SSL is shifted to a low level and the sense signal PBSENSE and the even select signal BSLE both having a low level are supplied, all the word lines Sel.WL and Un.WL and the drain select line DSL are discharged.

Figure 6:
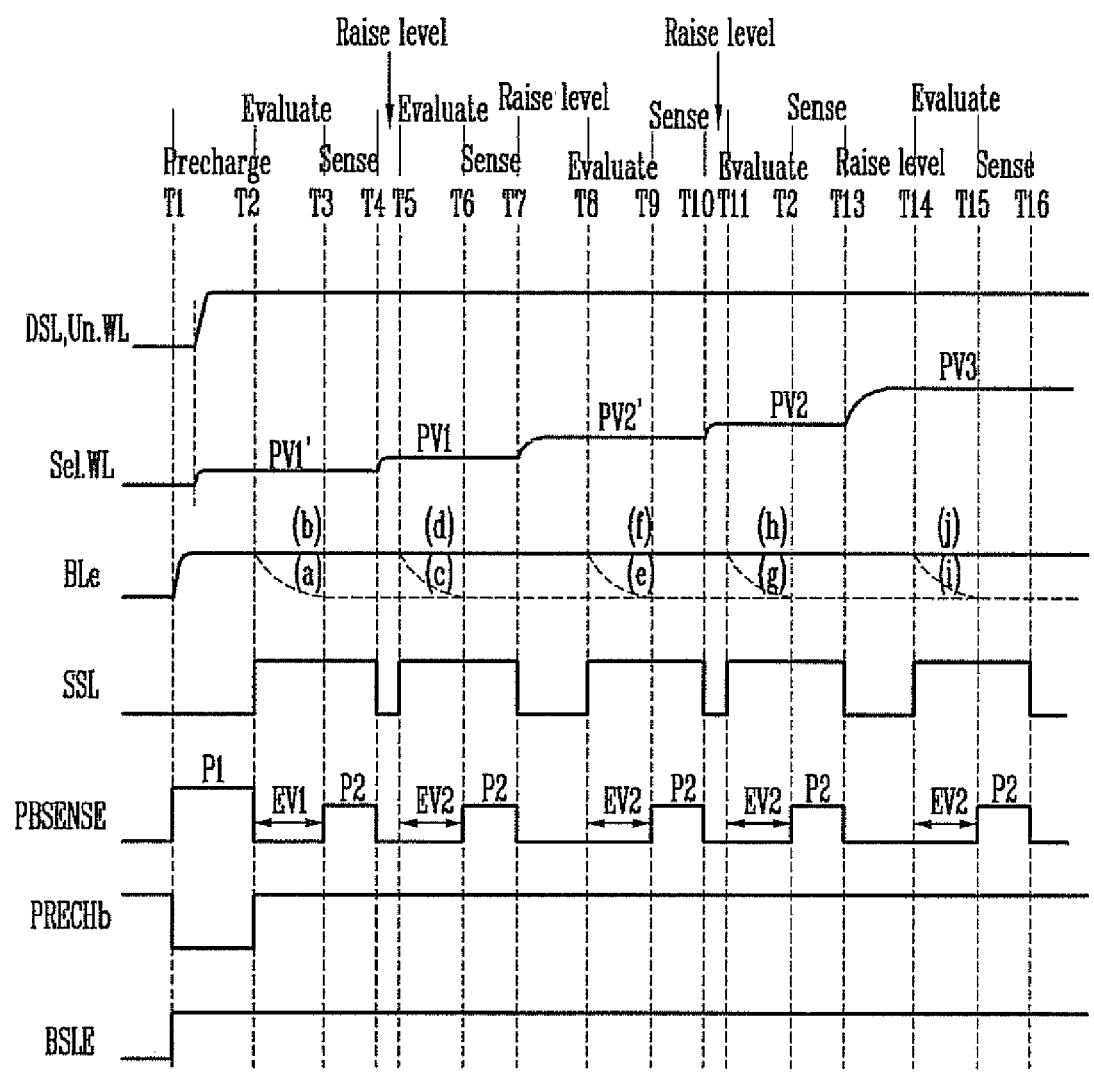
FIG. 6 is a timing diagram illustrating a verify operation according to a third embodiment of this disclosure.

FIG. 6 is a timing diagram illustrating a verify operation according to a third embodiment of this disclosure.

Referring to FIG. 6, after a selected word line Sel.WL is once precharged, verify operations T1 to T16 with a plurality of levels are consecutively performed using the precharged level. The verify operations T1 to T16 are described in detail below.

(T1 to T2) A bit line is precharged.

The sense node SO is precharged by supplying the precharge signal PRECHb of a low level to the sixth switch N06, and the precharged sense node SO is coupled to the even bit line BLe by supplying the sense signal PBSENSE and the even select signal BSLE both having a high level to precharge the even bit line BLe. The sense signal PBSENSE has a first voltage P1 to precharge the even bit line BLe. Here, the voltage of the odd bit line BLo maintains a low level. After the even bit line BLe is precharged, a turn-on voltage is supplied to the drain select line DSL, and a first verify voltage PV1' is supplied to a selected word line Sel.WL to couple the strings STe and STo to the precharged bit line BLe. The first verify voltage PV1' is lower than the first target voltage PV1 (more specifically, the target level of the first state MPV1) to narrow the width of a distribution of the threshold voltages of the memory cells that are coupled to the selected word line Sel.WL and that will be programmed in the first state MPV1. When the first verify voltage PV1' is supplied to the selected word line Sel.WL, the pass voltage Vpass is supplied to the unselected word lines Un.WL other than the selected word line Sel.WL.

(T2 to T3) An evaluation operation that evaluates if the state of a selected memory cell is incorporated to the bit lines is performed.

The precharging of the sense node SO is stopped in response to the precharge signal PRECHb of a high level, and the sense node SO and the even bit line BLe are electrically disconnected in response to the sense signal PBSENSE of a low level. In order to incorporate the state of a selected memory cell to the bit lines, the turn-on voltage of a high level is supplied to the source select line SSL. When the turn-on voltage is supplied to the source select line SSL, the source select transistor SST is turned on, and the common source line CSL having the ground level is coupled to the string STe or STo coupled to the selected memory cell. When the threshold voltage of the selected memory cell is lower than the first verify voltage PV1', the common source line CSL having the ground level is coupled to the even bit line BLe because a channel is formed in the entire even string STe, and the potential of the even bit line BLe is lowered (a). If the threshold voltage of the selected memory cell is higher than the first verify voltage PV1', the precharge level of the even bit line BLe does not drop because a channel is not formed in the selected memory cell (b). The evaluation operation T2 to T3 is performed during a first time EV1.

(T3 to T4) A potential of the bit line is sensed.

A potential of the even bit line BLe, which has the state of the selected memory cell incorporated into it, is detected by supplying the sense signal PBSENSE having a second voltage P2 lower than the first voltage P1. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the even bit line BLe maintains a precharge level (b) (more specifically, the threshold voltage of the selected memory cell has reached the first verify voltage PV1'), the voltage of the sense node SO maintains a high level. If the potential of the even bit line BLe is lower than the precharge level (a) (more specifically, the threshold voltage of the selected memory cell has not reached the first verify voltage PV1'), the voltage of the sense node SO shifts to a low level. Whether the threshold voltage of the selected memory cell is higher or lower than the first verify voltage PV1' is determined by sensing the changed potential of the sense node SO.

(T4 to T5) The level of voltage supplied to the selected word line is raised.

More specifically, the fifth switch N05 and the source select transistor SST are turned off (T4) by supplying the sense signal PBSENSE of a low level and supplying voltage of a low level to the source select line SSL. In order to verify whether the threshold voltages of memory cells to be programmed in the first state MPV1 have reached the first target voltage PV1 (more specifically, the target level of the first state MPV1), the first target voltage PV1 is supplied to the selected word line Sel.WL.

(T5 to T6) An evaluation operation that evaluates if the state of the selected memory cell is incorporated to the bit lines is performed.

In order to incorporate the state of the selected memory cell to the bit lines, the turn-on voltage of a high level is supplied to the source select line SSL. When the turn-on voltage is supplied to the source select line SSL, the source select transistor SST is turned on, and the common source line CSL having the ground level is coupled to the strings STe or STo. When the threshold voltage of the selected memory cell is lower than the first target voltage PV1, the common source line CSL having the ground level is coupled to the even bit line BLe because a channel is formed in the entire even string STe, and the potential of the even bit line BLe is lowered (c). If the threshold voltage of the selected memory cell is higher than the first target voltage PV1, the precharge level of the even bit line BLe does not drop because a channel is not formed in the selected memory cell (d). The evaluation section T5 to T6 is performed during a second time EV2 shorter than the first time EV1.

The time for the evaluation operation T5 to T6 is reduced to the second time EV2 is to incorporate the state of the selected memory cell into the even bit line BLe before the threshold voltage of the selected memory cell falls below the first target voltage PV1 when the precharge level of the precharged even bit line BLe is lowered by leakage. Particularly, the leakage of the precharged even bit line BLe is generated when the source select transistor SST is turned on when the common source line CSL is grounded. Accordingly, the time for the evaluation operation T5 to T6 may be controlled by changing a point in time T5 when the turn-on voltage is supplied to the source select line SSL or a point in time T6 when the sense signal PBSENSE shifts to a high level. More specifically, to reduce the time for the evaluation operation T5 to T6, the point in time T5 when the turn-on voltage is supplied to the source select line SSL may be delayed, or the point in time T6 when the sense signal PBSENSE shifts to a high level may be shortened. The point in time T5 when the turn-on voltage is supplied to the source select line SSL is preferrably delayed. If the point in time T5 when the turn-on voltage is supplied to the source select line SSL is delayed, the leakage of the even bit line BLe is measured, and the point in time T5 when the turn-on voltage is supplied to the source select line SSL is controlled such that the potential of the precharged even bit line BLe lowered according to the measured leakage does not reach a verify voltage or a target voltage used in a verify operation.

(T6 to T7) A potential of the bit line is sensed.

A potential of the even bit line BLe, which has the state of the selected memory cell incorporated into it, is sensed by supplying the fifth switch N05 with the sense signal PBSENSE having the second voltage P2. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the voltage of the even bit line BLe maintains the precharge level (d) (more specifically, if the threshold voltage of the selected memory cell has reached the first target voltage PV1), the voltage of the sense node SO maintains a high level. If the voltage of the even bit line BLe has shifted to a level lower than the precharge level (c) (more specifically, if the threshold voltage of the selected memory cell has not reached the first target voltage PV1), the voltage of the sense node SO shifts a low level. Whether the threshold voltage of the selected memory cell has reached the first target voltage PV1 or not is determined by sensing the changed potential of the sense node SO.

(T7 to T8) The level of voltage supplied to the selected word line is raised.

More specifically, after the verify operation (T1 to T7) for the first state MPV1 is performed, the verify operation for the second state MPV2 is performed without an operation of discharging the bit lines BLe and BLo. To this end, the fifth switch N05 and the source select transistor SST are turned off by shifting the sense signal PBSENSE to a low level and supplying voltage of a low level to the source select line SSL. Next, in order to verify whether the threshold voltages of memory cells to be programmed in the second state MPV2 have reached the second verify voltage PV2' lower than the second target voltage PV2 (more specifically, the target level of the second state MPV2), the second verify voltage PV2' is supplied to the selected word line Sel.WL. At this time, the pass voltage Vpass continues to be supplied to the unselected word lines Un.WL other than the selected word line Sel.WL. More specifically, the second verify voltage PV2' continues to be supplied to the selected word line Sel.WL, which is supplied to the first target voltage PV1.

(T8 to T9) An evaluation operation that evaluates if the state of a selected memory cell is incorporated to the bit lines is performed.

More specifically, in order to incorporate the state of the selected memory cell to the bit lines, the turn-on voltage of a high level is supplied to the source select line SSL. When the turn-on voltage is supplied to the source select line SSL, the source select transistor SST is turned on, and the common source line CSL having the ground level is coupled to the string STe or STo. When the threshold voltage of the selected memory cell is lower than the second verify voltage PV2', the common source line CSL having the ground level is coupled to the even bit line BLe because a channel is formed in the entire even string STe by the pass voltage Vpass and the second verify voltage PV2'. Thus, the potential of the even bit line BLe is lowered (e). When the threshold voltage of the selected memory cell is higher than the second verify voltage PV2', the precharge level of the even bit line BLe does not drop because a channel is not formed in the selected memory cell (f). However, leakage may be generated because the precharge level, which is used in the first verify operation, continues to be used. For this reason, the evaluation operation T8 to T9 is performed during the second time EV2 shorter than the first time EV1. The time for the evaluation operation T8 to T9 may be controlled by changing a point in time T8 when the turn-on voltage is supplied to the source select line SSL or a point in time T9 when the sense signal PBSENSE shifts to a high level. More specifically, in order to reduce the time for the evaluation operation T8 to T9, the point in time T8 when the turn-on voltage is supplied to the source select line SSL may be delayed, or the point in time T9 when the sense signal PBSENSE shifts to a high level may be shortened. The point in time T8 when the turn-on voltage is supplied to the source select line SSL is preferably delayed.

(T9 to T10) A potential of the bit line is sensed.

A potential of the even bit line BLe, which has the state of the selected memory cell incorporated into it, is sensed by supplying the sense signal PBSENSE having the second voltage P2. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the voltage of the even bit line BLe maintains the precharge level (f) (more specifically, if the threshold voltage of the selected memory cell has reached the second verify voltage PV2'), the voltage of the sense node SO maintains a high level. If the voltage of the even bit line BLe has shifted to a level lower than the precharge level (e) (more specifically, if the threshold voltage of the selected memory cell has not reached the second verify voltage PV2'), the voltage of the sense node SO shifts to a low level.

(T10 to T11) The level of voltage supplied to the selected word line is raised.

More specifically, the fifth switch N05 and the source select transistor SST are turned off (T4) by shifting the sense signal PBSENSE to a low level and supplying voltage of a low level to the source select line SSL. Next, to verify whether the threshold voltages of the memory cells to be programmed in the second state MPV2 have reached the second target voltage PV2 (more specifically, the target level of the second state MPV2), the second target voltage PV2 is supplied to the selected word line Sel.WL.

(T11 to T12) An evaluation operation that evaluates if the state of a selected memory cell is incorporated to the bit lines is performed.

More specifically, in order to incorporate the state of a selected memory cell to the bit lines, the turn-on voltage of a high level is supplied to the source select line SSL. When the turn-on voltage is supplied to the source select line SSL, the source select transistor SST is turned on, and the common source line CSL having the ground level is coupled to the string STe or STo. When the threshold voltage of the selected memory cell is lower than the second target voltage PV2, the common source line CSL having the ground level is coupled to the even bit line BLe because a channel is formed in the entire even string STe by the pass voltage Vpass and the second target voltage PV2. Thus, the potential of the even bit line BLe is lowered (g). If the threshold voltage of the selected memory cell is higher than the second target voltage PV2, the precharge level of the even bit line BLe does not drop because a channel is not formed in the selected memory cell (h). However, leakage may be generated because the precharge level, which is used in the first verify operation, continues to be used. For this reason, the evaluation operation T11 to T12 is performed during the second time EV2 shorter than the first time EV1. The time for the evaluation operation T11 to T12 may be controlled by changing a point in time T11 when the turn-on voltage is supplied to the source select line SSL or a point in time T12 when the sense signal PBSENSE shifts to a high level. More specifically, to reduce the time for the evaluation operation T11 to T12, the point in time T11 when the turn-on voltage is supplied to the source select line SSL may be delayed, or the point in time T12 when the sense signal PBSENSE shifts to a high level may be shortened. The point in time T11 when the turn-on voltage is supplied to the source select line SSL is preferably delayed.

(T12 to T13) A potential of the bit line is sensed.

A potential of the even bit line BLe, which has the state of the selected memory cell incorporated into it, is sensed by supplying the sense signal PBSENSE having the second voltage P2. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the voltage of the even bit line BLe maintains the precharge level (h) (more specifically, if the threshold voltage of the selected memory cell has reached the second target voltage PV2), the voltage of the sense node SO maintains a high level. If the voltage of the even bit line BLe has shifted to a level lower than the precharge level (g) (more specifically, if the threshold voltage of the selected memory cell has not reached the second target voltage PV2), the voltage of the sense node SO shifts to a low level.

(T13 to T14) The level of voltage supplied to the selected word line is raised.

More specifically, after the verify operation (T7 to T13) for the second state MPV2 is performed, a verify operation for the third state MPV3 is performed without an operation of discharging the bit lines BLe and BLo. To this end, the fifth switch N05 and the source select transistor SST are turned off by shifting the sense signal PBSENSE to a low level and supplying voltage of a low level to the source select line SSL. Next, in order to verify whether the threshold voltages of memory cells to be programmed in the third state MPV3 have reached the third target voltage PV3 (more specifically, the target level of the third state MPV3), the third target voltage PV3 is supplied to the selected word line Sel.WL. At this time, the pass voltage Vpass continues to be supplied to the unselected word lines Un.WL other than the selected word line Sel.WL. More specifically, the third target voltage PV3 continues to be supplied to the selected word line Sel.WL, which is supplied to the second target voltage PV2.

(T14 to T15) An evaluation operation that evaluates if the state of a selected memory cell is incorporated to the bit lines is performed.

More specifically, in order to incorporate the state of a selected memory cell to the bit lines, the turn-on voltage of a high level is supplied to the source select line SSL. When the turn-on voltage is supplied to the source select line SSL, the source select transistor SST is turned on, and the common source line CSL having the ground level is coupled to the string STe or STo. When the threshold voltage of the selected memory cell is lower than the third target voltage PV3, the common source line CSL having the ground level is coupled to the even bit line BLe because a channel is formed in the entire even string STe by the pass voltage Vpass and the third verify voltage PV3'. Thus, the potential of the even bit line BLe is lowered (i). If the threshold voltage of the selected memory cell is higher than the third verify voltage PV3', the precharge level of the even bit line BLe does not drop because a channel is not formed in the selected memory cell (j). However, leakage may be generated because the precharge level, which is used in the first verify operation, continues to be used. For this reason, the evaluation operation T14 to T15 is performed during the second time EV2 shorter than the first time EV1. The time for the evaluation operation T14 to T15 may be controlled by changing a point in time T14 when the turn-on voltage is supplied to the source select line SSL or a point in time T15 when the sense signal PBSENSE shifts to a high level. More specifically, in order to reduce the time for the evaluation operation T14 to T15, the point in time T14 when the turn-on voltage is supplied to the source select line SSL may be delayed, or the point in time T15 when the sense signal PBSENSE shifts to a high level may be shortened. The point in time T14 when the turn-on voltage is supplied to the source select line SSL is preferably delayed.

(T15 to T16) A potential of the bit line is sensed.

A potential of the even bit line BLe, which has the state of the selected memory cell incorporated into it, is sensed by supplying the sense signal PBSENSE having the second voltage P2. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the voltage of the even bit line BLe maintains the precharge level (j) (more specifically, if the threshold voltage of the selected memory cell has reached the second target voltage PV2), the voltage of the sense node SO maintains a high level. If the voltage of the even bit line BLe has shifted to a level lower than the precharge level (i) (more specifically, if the threshold voltage of the selected memory cell has not reached the second target voltage PV2), the voltage of the sense node SO shifts to a low level.

As described above, after the verify operations for the first to third states MPV1 to MPV3 are performed, the potentials of the bit lines BLe and BLo are changed according to the results of the verify operations, and a program operation is repeatedly performed until the threshold voltages of all memory cells to be programmed reach designated target voltages while gradually raising a program pulse.

Figure 7:
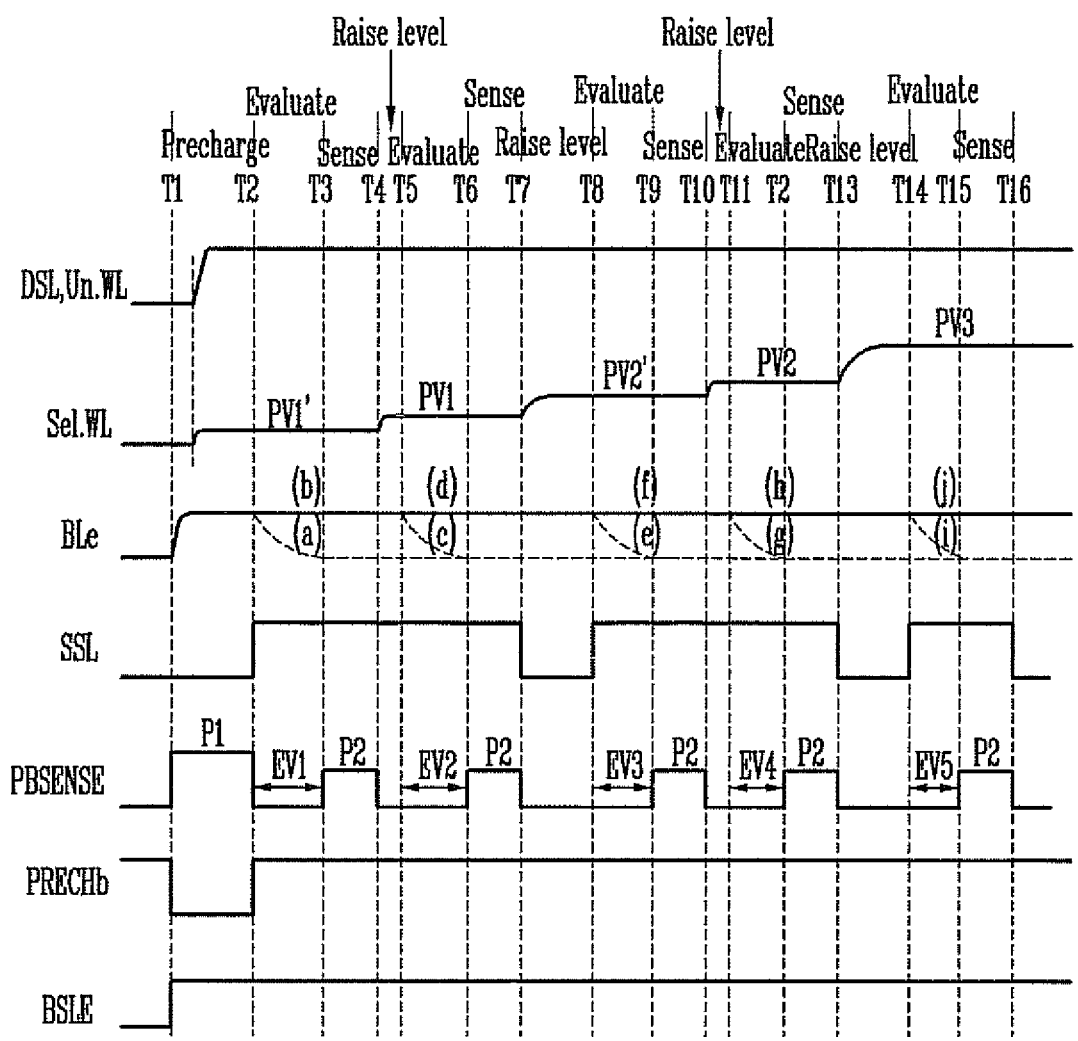
FIG. 7 is a timing diagram illustrating a verify operation according to a fourth embodiment of this disclosure.

FIG. 7 is a timing diagram illustrating a verify operation according to a fourth embodiment of this disclosure.

Referring to FIG. 7, after the selected word line Sel.WL is precharged once, verify operations T1 to T16 with a plurality of levels are consecutively performed using the precharged level. Here, the verify operations are performed while gradually shortening the time for each evaluation operation. The verify operations T1 to T16 are described in detail below.

(T1 to T2) A bit line is precharged.

The sense node SO is precharged by supplying the precharge signal PRECHb of a low level to the sixth switch N06, and the precharged sense node SO is coupled to the even bit line BLe by supplying the sense signal PBSENSE and the even select signal BSLE both having a high level to precharge the even bit line BLe. The sense signal PBSENSE has a first voltage P1 to precharge the even bit line BLe. Here, the voltage of the odd bit line BLo maintains a low level. After the even bit line BLe is precharged, a turn-on voltage is supplied to the drain select line DSL, and a first verify voltage PV1' is supplied to a selected word line Sel.WL to couple the strings STe and STo to the precharged bit line BLe. The first verify voltage PV1' is lower than the first target voltage PV1 (more specifically, the target level of the first state MPV1) to narrow the width of a distribution of the threshold voltages of the memory cells that are coupled to the selected word line Sel.WL and that will be programmed in the first state MPV1. When the first verify voltage PV1' is supplied to the selected word line Sel.WL, the pass voltage Vpass is supplied to the unselected word lines Un.WL other than the selected word line Sel.WL.

(T2 to T3) An evaluation operation that evaluates if the state of a selected memory cell is incorporated to the bit lines is performed.

The precharging of the sense node SO is stopped in response to the precharge signal PRECHb of a high level, and the sense node SO and the even bit line BLe are electrically disconnected in response to the sense signal PBSENSE of a low level. In order to incorporate the state of a selected memory cell to the bit lines, the turn-on voltage of a high level is supplied to the source select line SSL. When the turn-on voltage is supplied to the source select line SSL, the source select transistor SST is turned on, and the common source line CSL having the ground level is coupled to the string STe or STo coupled to the selected memory cell. When the threshold voltage of the selected memory cell is lower than the first verify voltage PV1', the common source line CSL having the ground level is coupled to the even bit line BLe because a channel is formed in the entire even string STe, and the potential of the even bit line BLe is lowered (a). If the threshold voltage of the selected memory cell is higher than the first verify voltage PV1', the precharge level of the even bit line BLe does not drop because a channel is not formed in the selected memory cell (b). The evaluation operation T2 to T3 is performed during a first time EV1.

(T3 to T4) A potential of the bit line is sensed.

A potential of the even bit line BLe, which has the state of the selected memory cell incorporated into it, is detected by supplying the sense signal PBSENSE having a second voltage P2 lower than the first voltage P1. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the even bit line BLe maintains a precharge level (b) (more specifically, the threshold voltage of the selected memory cell has reached the first verify voltage PV1'), the voltage of the sense node SO maintains a high level. If the potential of the even bit line BLe is lower than the precharge level (a) (more specifically, the threshold voltage of the selected memory cell has not reached the first verify voltage PV1'), the voltage of the sense node SO shifts to a low level. Whether the threshold voltage of the selected memory cell is higher than or lower than the first verify voltage PV1' is determined by sensing the changed potential of the sense node SO.

(T4 to T5) The level of voltage supplied to the selected word line is raised.

More specifically, the fifth switch N05 and the source select transistor SST are turned off (T4) by supplying the sense signal PBSENSE of a low level and supplying voltage of a low level to the source select line SSL. In order to verify whether the threshold voltages of memory cells to be programmed in the first state MPV1 have reached the first target voltage PV1 (more specifically, the target level of the first state MPV1), the first target voltage PV1 is supplied to the selected word line Sel.WL.

(T5 to T6) An evaluation operation that evaluates if the state of the selected memory cell is incorporated to the bit lines is performed.

In order to incorporate the state of the selected memory cell to the bit lines, the turn-on voltage of a high level is supplied to the source select line SSL. When the turn-on voltage is supplied to the source select line SSL, the source select transistor SST is turned on, and the common source line CSL having the ground level is coupled to the strings STe or STo. When the threshold voltage of the selected memory cell is lower than the first target voltage PV1, the common source line CSL having the ground level is coupled to the even bit line BLe because a channel is formed in the entire even string STe, and the potential of the even bit line BLe is lowered (c).

If the threshold voltage of the selected memory cell is higher than the first target voltage PV1, the precharge level of the even bit line BLe does not drop because a channel is not formed in the selected memory cell (d). The evaluation operation T5 to T6 is performed during a second time EV2 shorter than the first time EV1.

The time for the evaluation operation T5 to T6 is reduced to the second time EV2 is to incorporate the state of the selected memory cell into the even bit line BLe before the threshold voltage of the selected memory cell falls below the first target voltage PV1 when the precharge level of the precharged even bit line BLe is lowered by leakage. Particularly, the leakage of the precharged even bit line BLe is generated when the source select transistor SST is turned on when the common source line CSL is grounded. Accordingly, the time for the evaluation operation T5 to T6 may be controlled by changing a point in time T5 when the turn-on voltage is supplied to the source select line SSL or a point in time T6 when the sense signal PBSENSE shifts to a high level. More specifically, to reduce the time for the evaluation operation T5 to T6, the point in time T5 when the turn-on voltage is supplied to the source select line SSL may be delayed, or the point in time T6 when the sense signal PBSENSE shifts to a high level may be shortened. The point in time T5 when the turn-on voltage is supplied to the source select line SSL is preferably delayed. If the point in time T5 when the turn-on voltage is supplied to the source select line SSL is delayed, the leakage of the even bit line BLe is measured, and the point in time T5 when the turn-on voltage is supplied to the source select line SSL is controlled such that the potential of the precharged even bit line BLe lowered according to the measured leakage does not reach a verify voltage or a target voltage used in a verify operation.

(T6 to T7) A potential of the bit line is sensed.

A potential of the even bit line BLe, which has the state of the selected memory cell incorporated into it, is sensed by supplying the fifth switch N05 with the sense signal PBSENSE having the second voltage P2. More specifically, when the third switch N03 is turned on, the fifth switch N05 is turned on in response to the sense signal PBSENSE of a high level, and the potential of the even bit line BLe, which has the state of the selected memory cell incorporated into it, is transferred to is transferred to the sense node SO. If the voltage of the even bit line BLe maintains the precharge level (d) (more specifically, if the threshold voltage of the selected memory cell has reached the first target voltage PV1), the voltage of the sense node SO maintains a high level. If the voltage of the even bit line BLe has shifted to a level lower than the precharge level (c) (more specifically, if the threshold voltage of the selected memory cell has not reached the first target voltage PV1), the voltage of the sense node SO shifts a low level. Whether the threshold voltage of the selected memory cell has reached the first target voltage PV1 or not is determined by sensing the changed potential of the sense node SO.

(T7 to T8) The level of voltage supplied to the selected word line is raised.

More specifically, after the verify operation (T1 to T7) for the first state MPV1 is performed, the verify operation for the second state MPV2 is performed without an operation of discharging the bit lines BLe and BLo. To this end, the fifth switch N05 and the source select transistor SST are turned off by shifting the sense signal PBSENSE to a low level and supplying voltage of a low level to the source select line SSL. Next, in order to verify whether the threshold voltages of memory cells to be programmed in the second state MPV2 have reached the second verify voltage PV2' lower than the second target voltage PV2 (more specifically, the target level of the second state MPV2), the second verify voltage PV2' is supplied to the selected word line Sel.WL. At this time, the pass voltage Vpass continues to be supplied to the unselected word lines Un.WL other than the selected word line Sel.WL. More specifically, the second verify voltage PV2' continues to be supplied to the selected word line Sel.WL, which is supplied to t first target voltage PV1.

(T8 to T9) An evaluation operation that evaluates if the state of a selected memory cell is incorporated to the bit lines is performed.

More specifically, in order to incorporate the state of the selected memory cell to the bit lines, the turn-on voltage of a high level is supplied to the source select line SSL. When the turn-on voltage is supplied to the source select line SSL, the source select transistor SST is turned on, and the common source line CSL having the ground level and the string STe or STo are coupled. When the threshold voltage of the selected memory cell is lower than the second verify voltage PV2', the common source line CSL having the ground level is coupled to the even bit line BLe because a channel is formed in the entire even string STe by the pass voltage Vpass and the second verify voltage PV2'. Thus, the potential of the even bit line BLe is lowered (e). When the threshold voltage of the selected memory cell is higher than the second verify voltage PV2', the precharge level of the even bit line BLe does not drop because a channel is not formed in the selected memory cell (f). However, leakage may be generated because the precharge level, which is used in the first verify operation, continues to be used. For this reason, the evaluation operation T8 to T9 is performed during a third time EV3 shorter than the second time EV2. The time for the evaluation operation T8 to T9 may be controlled by changing a point in time T8 when the turn-on voltage is supplied to the source select line SSL or a point in time T9 when the sense signal PBSENSE shifts to a high level. More specifically, in order to reduce the time for the evaluation operation T8 to T9, the point in time T8 when the turn-on voltage is supplied to the source select line SSL may be delayed, or the point in time T9 when the sense signal PBSENSE shifts to a high level may be shortened. The point in time T8 when the turn-on voltage is supplied to the source select line SSL is preferably delayed.

(T9 to T10) A potential of the bit line is sensed.

A potential of the even bit line BLe, which has the state of the selected memory cell incorporated into it, is sensed by supplying the sense signal PBSENSE having the second voltage P2. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the voltage of the even bit line BLe maintains the precharge level (f) (more specifically, if the threshold voltage of the selected memory cell has reached the second verify voltage PV2'), the voltage of the sense node SO maintains a high level. If the voltage of the even bit line BLe has shifted to a level lower than the precharge level (e) (more specifically, if the threshold voltage of the selected memory cell has not reached the second verify voltage PV2'), the voltage of the sense node SO shifts to a low level.

(T10 to T11) The level of voltage supplied to the selected word line is raised.

More specifically, the fifth switch N05 and the source select transistor SST are turned off (T4) by shifting the sense signal PBSENSE to a low level and supplying voltage of a low level to the source select line SSL. Next, to verify whether the threshold voltages of the memory cells to be programmed in the second state MPV2 have reached the second target voltage PV2 (more specifically, the target level of the second state MPV2), the second target voltage PV2 is supplied to the selected word line Sel.WL.

(T11 to T12) An evaluation operation that evaluates if the state of a selected memory cell is incorporated to the bit lines is performed.

More specifically, in order to incorporate the state of a selected memory cell to the bit lines, the turn-on voltage of a high level is supplied to the source select line SSL. When the turn-on voltage is supplied to the source select line SSL, the source select transistor SST is turned on, and the common source line CSL having the ground level is coupled to the string STe or STo. When the threshold voltage of the selected memory cell is lower than the second target voltage PV2, the common source line CSL having the ground level is coupled to the even bit line BLe because a channel is formed in the entire even string STe by the pass voltage Vpass and the second target voltage PV2. Thus, the potential of the even bit line BLe is lowered (g). If the threshold voltage of the selected memory cell is higher than the second target voltage PV2, the precharge level of the even bit line BLe does not drop because a channel is not formed in the selected memory cell (h). However, leakage may be generated because the precharge level, which is used in the first verify operation, continues to be used. For this reason, the evaluation operation T11 to T12 is performed during a fourth time EV4 shorter than the third time EV3. The time for the evaluation operation T11 to T12 may be controlled by changing a point in time T11 when the turn-on voltage is supplied to the source select line SSL or a point in time T12 when the sense signal PBSENSE shifts to a high level. More specifically, to reduce the time for the evaluation operation T11 to T12, the point in time T11 when the turn-on voltage is supplied to the source select line SSL may be delayed, or the point in time T12 when the sense signal PBSENSE shifts to a high level may be shortened. The point in time T11 when the turn-on voltage is supplied to the source select line SSL is preferably delayed.

(T12 to T13) A potential of the bit line is sensed.

A potential of the even bit line BLe, which has the state of the selected memory cell incorporated into it, is sensed by supplying the sense signal PBSENSE having the second voltage P2. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the voltage of the even bit line BLe maintains the precharge level (h) (more specifically, if the threshold voltage of the selected memory cell has reached the second target voltage PV2), the voltage of the sense node SO maintains a high level. If the voltage of the even bit line BLe has shifted to a level lower than the precharge level (g) (more specifically, if the threshold voltage of the selected memory cell has not reached the second target voltage PV2), the voltage of the sense node SO shifts to a low level.

(T13 to T14) The level of voltage supplied to the selected word line is raised.

More specifically, after the verify operation (T7 to T13) for the second state MPV2 is performed, a verify operation for the third state MPV3 is performed without an operation of discharging the bit lines BLe and BLo. To this end, the fifth switch N05 and the source select transistor SST are turned off by shifting the sense signal PBSENSE to a low level and supplying voltage of a low level to the source select line SSL. Next, in order to verify whether the threshold voltages of memory cells to be programmed in the third state MPV3 have reached the third target voltage PV3 (more specifically, the target level of the third state MPV3), the third target voltage PV3 is supplied to the selected word line Sel.WL. At this time, the pass voltage Vpass continues to be supplied to the unselected word lines Un.WL other than the selected word line Sel.WL. More specifically, the third target voltage PV3 continues to be supplied to the selected word line Sel.WL, which is supplied to the second target voltage PV2.

(T14 to T15) An evaluation operation that evaluates if the state of a selected memory cell is incorporated to the bit lines is performed.

More specifically, in order to incorporate the state of a selected memory cell to the bit lines, the turn-on voltage of a high level is supplied to the source select line SSL. When the turn-on voltage is supplied to the source select line SSL, the source select transistor SST is turned on, and the common source line CSL having the ground level is coupled to the string STe or STo. When the threshold voltage of the selected memory cell is lower than the third target voltage PV3, the common source line CSL having the ground level is coupled to the even bit line BLe because a channel is formed in the entire even string STe by the pass voltage Vpass and the third verify voltage PV3'. Thus, the potential of the even bit line BLe is lowered (i). If the threshold voltage of the selected memory cell is higher than the third verify voltage PV3', the precharge level of the even bit line BLe does not drop because a channel is not formed in the selected memory cell (j). However, leakage may be generated because the precharge level, which is used in the first verify operation, continues to be used. For this reason, the evaluation operation T14 to T15 is performed during a fifth time EV5 shorter than the fourth time EV4. The time for the evaluation operation T14 to T15 may be controlled by changing a point in time T14 when the turn-on voltage is supplied to the source select line SSL or a point in time T15 when the sense signal PBSENSE shifts to a high level. More specifically, to reduce the time for the evaluation operation T14 to T15, the point in time T14 when the turn-on voltage is supplied to the source select line SSL may be delayed, or the point in time T15 when the sense signal PBSENSE shifts to a high level may be shortened. The point in time T14 when the turn-on voltage is supplied to the source select line SSL is preferably delayed.

(T15 to T16) A potential of the bit line is sensed.

A potential of the even bit line BLe, which has the state of the selected memory cell incorporated into it, is sensed by supplying the sense signal PBSENSE having the second voltage P2. More specifically, when the third switch N03 is turned on, the fifth switch N05 is turned on in response to the sense signal PBSENSE of a high level, and the potential of the even bit line BLe, which has the state of the selected memory cell incorporated into it, is transferred to the sense node SO. If the voltage of the even bit line BLe maintains the precharge level (j) (more specifically, if the threshold voltage of the selected memory cell has reached the second target voltage PV2), the voltage of the sense node SO maintains a high level. If the voltage of the even bit line BLe has shifted to a level lower than the precharge level (i) (more specifically, if the threshold voltage of the selected memory cell has not reached the second target voltage PV2), the voltage of the sense node SO shifts to a low level.

As described above, after the verify operations for the first to third states MPV1 to MPV3 are performed, the potentials of the bit lines BLe and BLo are changed according to the results of the verify operations, and a program operation is repeatedly performed until the threshold voltages of all memory cells to be programmed reach designated target voltages while gradually raising a program pulse. Although verify operations with a plurality of levels are performed, a bit line is precharged once, and the precharged level continues to used during the verify operations. Thus, the time taken to precharge the bit line may be reduced. Furthermore, the time taken to perform an operation where the potential of a bit line, which has the state of a memory cell incorporated therein, is evaluated is reduced. Accordingly, although the potential of a precharged bit line is lowered as a result of to a condition, such as leakage, a reduction in the reliability of a verify operation may be prevented because the evaluation operation is finished before the lowered potential is incorporated into the evaluation operation.

In accordance with this disclosure, in the verify operation of an MLC, memory cells with a plurality of levels are consecutively verified. Thus, the time taken to perform the verify operations may be reduced. Furthermore, although voltage of a precharged bit line is lowered as a result of to leakage, a reduction in the reliability of a verify operation may be prevented because the time taken to perform an evaluation operation during the verify operation is reduced.

What is claimed is:

1. An operating method of a semiconductor device, comprising:
    programming selected memory cells by supplying a program voltage to a selected word line coupled to the selected memory cells; and
    verifying the selected memory cells,
    wherein the verifying the selected memory cells comprises:
    precharging bit lines corresponding to the selected memory cells;
    supplying a first verify voltage to the selected word line and outputting programming states of the selected memory cells to the bit lines during a first time period;
    sensing potentials of the bit lines that have the programming states of the selected memory cells outputted to the bit lines during the first time period;
    supplying a first target voltage higher than the first verify voltage to the selected word line and outputting programming states of the selected memory cells to the bit lines during a second time period shorter than the first time period;
    sensing potentials of the bit lines that have the programming states of the selected memory cells outputted to the bit lines during the second time period;
    supplying a second target voltage higher than the first target voltage to the selected word line and outputting programming states of the selected memory cells to the bit lines during the second time period; and
    sensing potentials of the bit lines that have the programming states of the selected memory cells outputted to the bit lines during the second time period.

2. The operating method of claim 1, wherein a pass voltage is supplied to unselected word lines when the first verify voltage or the first target voltage is supplied to the selected word line.

3. The operating method of claim 1, wherein in sensing the potentials of the bit lines that have the programming states of the selected memory cells outputted to the bit lines during the first time period, the memory cells are determined to be erased cells when the potentials of the bit lines shift to a low level, and the memory cells are determined to be programmed cells when the potentials of the bit lines maintain a precharge level.

4. The operating method of claim 1, wherein supplying the first target voltage higher than the first verify voltage to the selected word line comprises:
    verifying the selected memory cells by supplying the first verify voltage to the selected word line, and consecutively supplying the first target voltage to the selected word line that is supplied with the first verify voltage.

5. The operating method of claim 1, further comprising sequentially performing a verify operation using a third target voltage higher than the second target voltage, after the potentials of the bit lines are sensed.

6. The operating method of claim 5, further comprising:
    discharging the bit lines before the second target voltage is supplied to the selected word line;
    precharging bit lines corresponding to selected memory cells;
    supplying a second verify voltage higher than the first target voltage, but lower than the second target voltage, to the selected word line and outputting programming states of the selected memory cells to the bit lines during the first time period; and
    sensing potentials of the bit lines that have the programming states of the selected memory cells outputted to the bit lines during the first time period.

7. The operating method of claim 6, wherein supplying the second target voltage to the selected word line comprises consecutively supplying the second target voltage higher than the second verify voltage to the selected word line that is supplied with the second verify voltage.

8. The operating method of claim 5, wherein the verify operation using the third target voltage comprises:
    discharging the bit lines after the verify operation using the second target voltage is performed;
    precharging bit lines corresponding to selected memory cells;
    supplying the third target voltage to the selected word line and outputting programming states of the selected memory cells to the bit lines during the first time period; and
    sensing potentials of the bit lines that have the states of the selected memory cells outputted to the bit lines during the first time period.

9. The operating method of claim 1, wherein the second time period is controlled by delaying a point in time when a turn-on voltage is supplied to a source select line of a memory cell array including the selected memory cells.

10. An operating method of a semiconductor device, comprising:
    precharging bit lines corresponding to selected memory cells;
    supplying a first verify voltage to a word line coupled to the selected memory cells and outputting programming states of the selected memory cells to the bit lines during a first time period;
    sensing potentials of the bit lines that have the programming states of the selected memory cells outputted to the bit lines during the first time period;
    consecutively supplying a first target voltage higher than the first verify voltage to the word line and outputting programming states of the selected memory cells to the bit lines during a second time period shorter than the first time period;
    sensing potentials of the bit lines that have the programming states of the selected memory cells outputted to the bit lines during the second time period;
    consecutively supplying a second target voltage higher than the first target voltage to the word line and outputting programming states of the selected memory cells to the bit lines during the second time period; and sensing potentials of the bit lines that have the programming states of the selected memory cells outputted to the bit lines during the second time period.

11. The operating method of claim 10, wherein:
a pass voltage is supplied to unselected word lines when the first target voltage is supplied to the word line, and the pass voltage continues to be supplied to the unselected word lines until the potentials of the bit lines that have the programming states of the selected memory cells outputted to the bit lines during the second time period are sensed.

12. The operating method of claim 10, further comprising verifying the selected memory cells using a second verify voltage lower than the second target voltage, but higher than the first target voltage, before consecutively supplying the second target voltage to the word line.

13. The operating method of claim 12, wherein the verifying the selected memory cells using the second verify voltage further comprises consecutively supplying the second verify voltage to the word line that is supplied with the first target voltage, outputting the programming states of the selected memory cells to the bit lines during the second time period, and subsequently sensing the potentials of the bit lines.

14. The operating method of claim 10, further comprising verifying the selected memory cells using a third target voltage higher than the second target voltage after sensing the potentials of the bit lines that have the programming states of the selected memory cells outputted to the bit lines during the second time period.

15. The operating method of claim 14, wherein verifying the selected memory cells using the third target voltage comprises consecutively supplying the third verify voltage to the word line that is supplied with the second target voltage, outputting programming states of the selected memory cells to the bit lines during the second time period, and subsequently sensing potentials of the bit lines.

16. The operating method of claim 10, wherein the second time period is controlled by delaying a point in time when a turn-on voltage is supplied to a source select line of a memory cell array including the selected memory cells.

17. An operating method of a semiconductor device, comprising:
precharging bit lines corresponding to selected memory cells;
supplying a first verify voltage to a selected word line coupled to the selected memory cells, outputting programming states of the selected memory cells to the bit lines during a first time period, and subsequently sensing potentials of the bit lines;
consecutively supplying a first target voltage higher than the first verify voltage to the selected word line, outputting programming states of the selected memory cells to the bit lines during a second time period shorter than the first time period, and subsequently sensing potentials of the bit lines;
consecutively supplying a second target voltage higher than the first target voltage to the selected word line, outputting programming states of the selected memory cells to the bit lines during a third time period shorter than the second time period, and subsequently sensing potentials of the bit lines; and consecutively supplying a third target voltage higher than the second target voltage to the selected word line, outputting programming states of the selected memory cells to the bit lines during a fourth time period shorter than the third time period, and subsequently sensing potentials of the bit lines.

18. The operating method of claim 17, further comprising supplying, before supplying the second target voltage to the selected word line, a second verify voltage higher than the first target voltage, but lower than the second target voltage to the selected word line, outputting programming states of the selected memory cells to the bit lines during a time period between the first time period and the second time period, and subsequently sensing potentials of the bit lines.

19. The operating method of claim 17, wherein an operation of outputting the programming states of the selected memory cells to the bit lines is controlled by delaying a point in time when a turn-on voltage is supplied to a source select line of a memory cell array including the selected memory cells.

20. A semiconductor device, comprising:
a memory cell array including a plurality of strings;
page buffers coupled to the plurality of strings through bit lines; and
a controller configured to control the page buffers to precharge bit lines corresponding to selected memory cells, supply a first verify voltage to a word line coupled to the selected memory cells and output programming states of the selected memory cells to the bit lines during a first time period, sense potentials of the bit lines that have the programming states of the selected memory cells outputted to the bit lines during the first time period, consecutively supply a first target voltage higher than the first verify voltage to the word line and output programming states of the selected memory cells to the bit lines during a second time period shorter than the first time period, sense potentials of the bit lines that have the programming states of the selected memory cells outputted to the bit lines during the second time period, consecutively supply a second target voltage higher than the first target voltage to the word line and output programming states of the selected memory cells to the bit lines during the second time period; and sense potentials of the bit lines that have the programming states of the selected memory cells outputted to the bit lines during the second time period.

21. The semiconductor device of claim 20, wherein the controller controls the time period when the programming states of the selected memory cells are verified by controlling a point in time when a voltage is supplied to a gate of a switch that couples a source select line of the memory cell array or the bit lines and the page buffers.

22. The semiconductor device of claim 21, wherein the controller delays point in time when a turn-on voltage is supplied to the source select line so that the point in time is later than a set time or shortens the point in time when the turn-on voltage is supplied to the gate of the switch so that the point in time is earlier than the set time to shorten the time when the states of the selected memory cells are verified.

* * * * *